US011371336B2

(12) United States Patent
Prochnow et al.

(10) Patent No.: US 11,371,336 B2
(45) Date of Patent: Jun. 28, 2022

(54) SYSTEMS AND METHODS FOR ESTIMATING REFINED RESERVOIR PRODUCTIVITY VALUES AS A FUNCTION OF POSITION IN A SUBSURFACE VOLUME OF INTEREST

(71) Applicant: CHEVRON U.S.A. INC., San Ramon, CA (US)

(72) Inventors: Shane James Prochnow, Fulshear, TX (US); Liliia Reddy, Houston, TX (US); Yuanbo Lin, Houston, TX (US); Petros Papazis, Houston, TX (US)

(73) Assignee: CHEVRON U.S.A. INC., San Ramon, CA (US)

( * ) Notice: Subject to any disclaimer, the term of this patent is extended or adjusted under 35 U.S.C. 154(b) by 300 days.

(21) Appl. No.: 16/576,698

(22) Filed: Sep. 19, 2019

(65) Prior Publication Data

US 2021/0087921 A1 Mar. 25, 2021

(51) Int. Cl.
*G06G 7/48* (2006.01)
*E21B 47/003* (2012.01)
(Continued)

(52) U.S. Cl.
CPC ............ *E21B 47/003* (2020.05); *G06F 30/20* (2020.01); *G06N 20/00* (2019.01)

(58) Field of Classification Search
CPC ........ E21B 47/003; G06N 20/00; G06F 30/20
(Continued)

(56) References Cited

U.S. PATENT DOCUMENTS 7,254,091 B1 8/2007 Gunning et al.
9,187,984 B2 11/2015 Usadi et al.
(Continued)

FOREIGN PATENT DOCUMENTS

WO WO 2017/188858 11/2017
WO WO 2018/132786 7/2018

OTHER PUBLICATIONS

International Search Report and Written Opinion dated May 6, 2020 for International Application No. PCT/US2020/018818, filed Feb. 19, 2020.
(Continued)

*Primary Examiner* — Andre Pierre Louis
(74) *Attorney, Agent, or Firm* — Sheppard, Mullin, Richter & Hampton LLP

(57) ABSTRACT

Systems and methods are disclosed for estimating reservoir productivity values that maximize reservoir productivity of a refined well design corresponding to a reservoir productivity parameter. A computer-implemented method may use a computer system that includes non-transient electronic storage, a graphical user interface, and one or more physical computer processors. The computer-implemented method may include: obtaining multiple limited production parameter values, obtaining multiple refined well designs, obtaining a productivity algorithm that predicts a reservoir productivity based on a production parameter and a well design, and generating multiple refined reservoir productivity values as a function of position in the subsurface volume of interest by applying the multiple refined well designs and the multiple limited production parameter values to the productivity algorithm.

19 Claims, 37 Drawing Sheets

(51) Int. Cl.
    *G06N 20/00*    (2019.01)
    *G06F 30/20*    (2020.01)

(58) Field of Classification Search
    USPC .................................................... 703/9, 10
    See application file for complete search history.

(56) References Cited

U.S. PATENT DOCUMENTS

| | | | |
|---|---|---|---|
| 10,415,349 B2* | 9/2019 | Ranjan | G06Q 10/0637 |
| 2004/0148147 A1 | 7/2004 | Martin | |
| 2009/0319243 A1 | 12/2009 | Suarez-Rivera et al. | |
| 2010/0071897 A1 | 3/2010 | Liu et al. | |
| 2010/0185424 A1 | 7/2010 | Massonnat | |
| 2011/0011595 A1 | 1/2011 | Huang et al. | |
| 2011/0290479 A1 | 12/2011 | Izgec et al. | |
| 2012/0010865 A1 | 1/2012 | Benson | |
| 2013/0096897 A1 | 4/2013 | Shahri | |
| 2014/0310634 A1 | 10/2014 | McLellan et al. | |
| 2014/0365409 A1 | 12/2014 | Burch et al. | |
| 2015/0284811 A1 | 10/2015 | Knight et al. | |
| 2016/0042272 A1 | 2/2016 | Mohaghegh | |
| 2016/0063402 A1 | 3/2016 | Webb et al. | |
| 2016/0259088 A1 | 9/2016 | Carvajal et al. | |
| 2016/0356125 A1 | 12/2016 | Bello et al. | |
| 2017/0108617 A1 | 4/2017 | Fei et al. | |
| 2017/0370213 A1 | 12/2017 | Knight et al. | |
| 2018/0188403 A1* | 7/2018 | Halsey | G01V 1/306 |
| 2018/0202264 A1 | 7/2018 | Sarduy et al. | |
| 2018/0231681 A1 | 8/2018 | Katterbauer et al. | |
| 2019/0025461 A1* | 1/2019 | Wiener | G01V 1/306 |
| 2019/0094403 A1 | 3/2019 | Prochnow et al. | |
| 2019/0094414 A1 | 3/2019 | Prochnow et al. | |
| 2019/0120998 A1 | 4/2019 | Prochnow et al. | |

OTHER PUBLICATIONS

International Search Report and Written Opinion dated Nov. 9, 2018 for International Application No. PCT/US2018/050639, filed Sep. 12, 2018.
International Search Report and Written Opinion dated Nov. 15, 2018 for International Application No. PCT/US2018/050624, filed Sep. 12, 2018.
International Search Report and Written Opinion dated Dec. 6, 2018 for International Application No. PCT/US2018/050892, filed Sep. 13, 2018.
Breiman, L., Random forests: Machine Learning 45, (2001) p. 5-12.
Hastie, T., et al. The Elements of Statistical Leaning: Data Mining, Inference, and Prediction (2nd Ed). Springer, New York, (2009) 764 pages.
Lashin "Reservoir parameter estimation using well logging data and production history of the Kaldarholt geothermal field, S—Iceland", United Nations University., UNU Geothermal Training Programme, Iceland. Report; Dec. 2005, 2005. Retrieved on Jun. 11, 2020, Retrieved from internet, https://rafhladan.is/handle/10802/7936> entire document. (38 pages).
Prochnow et al., Spatial Continuity and Surveillance Recommendations in the Permian Basin Tight Rock Wolfcamp: Autocorrealtion and Vario gram Analysis for Determining Extent of Reservoir Homogeneity: Unconventional Resources Technology Conference (URTeC) Manuscript 2669992 DOI 10.15530/urtec- 2017-2669992 (2017) 17 pages.
Wicker, J., et al. Multivariate Analytics of Seismic Inversion Products to Predict Horizontal Production in the Wolf camp Formation of the Midland Basin: Unconventional Resources Technology Conference, San Antonio, Texas, (Aug. 2016), Paper URTeC: 2449798, 9 pages.
Zhong et al., Do Data-Mining Methods Matter? A Wolfcamp Shale Case Study: SPE Hydraulic Fracturing Technology Conference, The Woodlands, Texas, USA, (Feb. 2015) SPE 173334, 12 pages.
International Search Report and Written Opinion dated Dec. 15, 2020 for International Application No. PCT/US2020/050725.

* cited by examiner data analytic derived pay

Chevron database includes 11,500 producing wells and tracks 400 well attributes.

- Leverage data analytics techniques to identify key well performance predictor variables.
- Target rock associated with better well performance to establish geologic target zones and landing strategies.

random forest data analytics model

Best multivariate method
- far more sophisticated that competitor approaches
- lowest risk of overfitting
- extreme randomization
- extremely iterative

- Training subset has X wells
- Each split is a variable bagging chosen at random from the subset, usually the square root of variables
- Statistically significant improvement allows the branch to grow to next bifurcation
- Singular trees become unpruned, thus over fit
- Each tree sees part of the training sets and captures some of the learning.

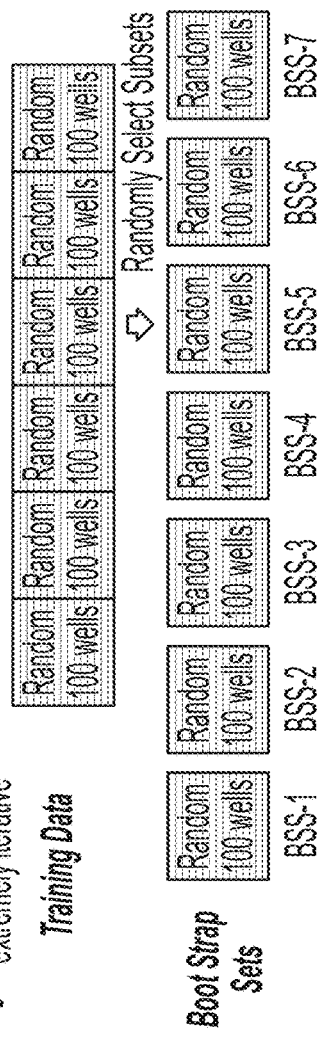

FIG. 2A

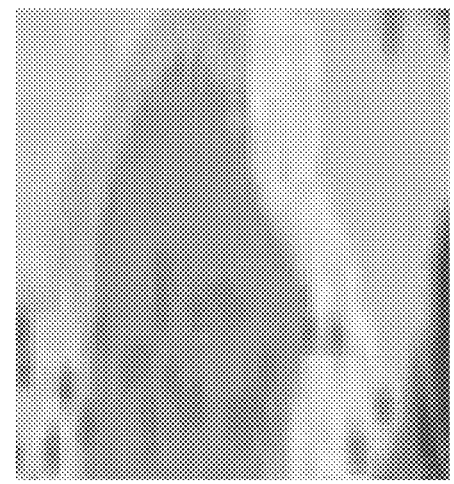
FIG. 6B
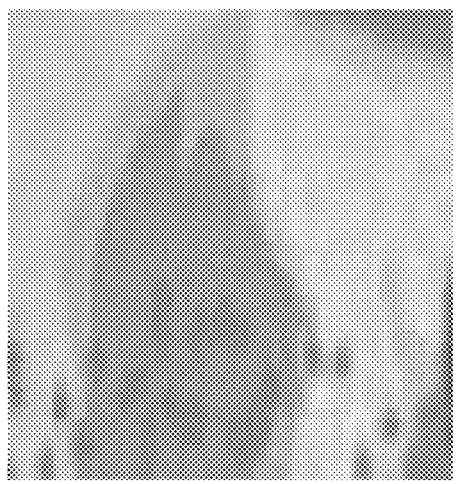
FIG. 6A
FIG. 6C
FIG. 6D

SYSTEMS AND METHODS FOR ESTIMATING REFINED RESERVOIR PRODUCTIVITY VALUES AS A FUNCTION OF POSITION IN A SUBSURFACE VOLUME OF INTEREST

RELATED APPLICATIONS

The disclosures of "Systems And Methods For Estimating Reservoir Productivity Values As A Function of Depth In A Subsurface Volume Of Interest" U.S. patent application Ser. No. 16/144,736, filed Sep. 27, 2018, "Systems And Methods For Estimating Reservoir Productivity As A Function of Position In A Subsurface Volume Of Interest" U.S. patent application Ser. No. 16/144,815, filed Sep. 27, 2018, and "Systems And Methods For Estimating A Well Design Reservoir Productivity As A Function of Position In A Subsurface Volume Of Interest Based On A Reservoir Productivity Parameter" U.S. patent application Ser. No. 16/281,018, filed Feb. 20, 2019 are hereby incorporated by reference herein.

FIELD OF THE DISCLOSURE

The present disclosure relates to systems and methods for estimating refined reservoir productivity values as a function of position in a subsurface volume of interest based on a refined well design.

SUMMARY

Implementations of the disclosure are directed to systems and methods for estimating reservoir productivity values that maximize reservoir productivity of a refined well design corresponding to a reservoir productivity parameter. In one implementation, a computer-implemented method may include a computer system. The computer system may include a physical computer processor and non-transient electronic storage. The computer-implemented method may include obtaining multiple limited production parameter values. The limited production parameter values may specify subsurface production features that affect the reservoir productivity. The computer-implemented method may also include obtaining multiple refined well designs. Individual ones of the multiple refined well designs may specify a design parameter value for a corresponding design parameter. The computer-implemented method may further include obtaining a productivity algorithm that predicts a reservoir productivity based on a production parameter and a well design. The computer-implemented method may also include generating multiple refined reservoir productivity values as a function of position in the subsurface volume of interest by applying the multiple refined well designs and the multiple limited production parameter values to the productivity algorithm.

In implementations, the productivity algorithm may be conditioned by training an initial productivity algorithm using productivity training data. The productivity training data may include (i) the production parameter values in the subsurface volume of interest, (ii) multiple sets of well designs in the subsurface volume of interest, and (iii) corresponding reservoir productivity values.

In implementations, the computer-implemented method may include a graphical user interface. The computer-implemented method may include generating a representation of refined reservoir productivity as a function of position in the subsurface volume of interest using visual effects to depict at least a portion of the refined reservoir productivity values. The computer-implemented method may also include displaying the representation.

In implementations, the computer-implemented method may include a graphical user interface. The computer-implemented method may include generating multiple completion efficiency values based on the refined reservoir productivity and the refined well design. The computer-implemented method may also include generating a representation of completion efficiency as a function of position in the subsurface volume of interest using visual effects to depict at least a portion of the multiple completion efficiency values. The computer-implemented method may further include displaying the representation.

In implementations, generating multiple completion efficiency values may include a ratio between the refined reservoir productivity values and corresponding well designs.

In implementations, the computer system may further include a graphical user interface. The computer-implemented method may include generating multiple recovery factor values. The computer-implemented method may also include generating a representation of recovery factor as a function of position in the subsurface volume of interest using visual effects to depict at least a portion of the multiple recovery factor values. The computer-implemented method may further include displaying the representation.

In implementations, generating multiple recovery factor values may be generated by performing a number of operations. One operation may include generating multiple storage volumes as a function of position in the subsurface volume of interest. Another operation may include generating the multiple recovery factor values based on the refined reservoir productivity and the storage volumes.

In implementations, the multiple refined well designs may be generated by performing a number of operations. One operation may include obtaining multiple well designs. Another operation may include generating predicted reservoir productivity values by applying the productivity algorithm to the multiple well designs. Another operation may include generating a best-fit function through a distribution of the multiple well designs and the predicted reservoir productivity values. Yet another operation may include parameterizing the best-fit function based on a reservoir productivity parameter.

In implementations, the reservoir productivity parameter may include one or more of a cost-value threshold value and a maximum recovery threshold value.

In implementations, the limited production parameter values may be generated by performing a number of operations. One operation may include obtaining subsurface data and well data corresponding to a subsurface volume of interest. Another operation may include obtaining a parameter model. Yet another operation may include generating multiple production parameter maps based on the subsurface data and the well data. Another operation may include generating limited production parameter values by applying the parameter model to the multiple production parameter maps.

In implementations, the parameter model may be conditioned by training an initial parameter model using training data. The training data may include (i) the well data of one or more wells in the subsurface volume of interest, and (ii) the production parameter values for corresponding multiple production parameters affecting productivity of the one or more wells as a function of position in the subsurface volume of interest.

In another implementation, a system is disclosed. The system may include non-transient electronic storage and a physical computer processor configured by machine-readable instructions to perform a number of operations. One operation may include obtaining multiple limited production parameter values. Another operation may include obtaining multiple refined well designs. Yet another operation may include obtaining a productivity algorithm that predicts a reservoir productivity based on a production parameter and a well design. Another operation may include generating multiple refined reservoir productivity values as a function of position in the subsurface volume of interest by applying the multiple refined well designs and multiple limited production parameter values to the productivity algorithm In implementations, the system may further include a graphical user interface. One of the operations may include generating a representation of the refined reservoir productivity values as a function of position in the subsurface volume of interest using visual effects to depict at least a portion of the refined reservoir productivity values. Another operation may include displaying the representation.

In implementations, the system may further include a graphical user interface. One operation may include generating multiple completion efficiency values based on the refined reservoir productivity and the refined well design. Another operation may include generating a representation of completion efficiency as a function of position in the subsurface volume of interest using visual effects to depict at least a portion of the multiple completion efficiency values. One operation may include display the representation.

In implementations, the system may further include a graphical user interface. One operation may include generating multiple recovery factor values. Yet another operation may include generating a representation of recovery factor as a function of position in the subsurface volume of interest using visual effects to depict at least a portion of the multiple recovery factor values. One operation may include displaying the representation.

In implementations, generating multiple recovery factor values may include generating storage volumes as a function of position in the subsurface volume of interest. Generating multiple recovery factor values may also include generating the multiple recovery factor values based on the refined reservoir productivity and the storage volumes.

In implementations, the multiple refined well designs may be generated by a number of operations. One operation may include obtaining multiple well designs. Another operation may include generating predicted reservoir productivity values by applying the productivity algorithm to the multiple well designs. Yet another operation may include generating a best-fit function through a distribution of the multiple well designs and the predicted reservoir productivity values. Another operation may include parameterizing the best-fit function based on a reservoir productivity parameter.

In implementations, the reservoir productivity parameter may include one or more of a cost-value threshold value and a maximum recovery threshold value.

In yet another implementation, a computer-implemented method for training an initial productivity algorithm is disclosed. The computer-implemented method may include a physical computer processor and non-transient electronic storage. The computer-implemented method may include obtaining productivity training data. The productivity training data may include (i) the production parameter values in the subsurface volume of interest, (ii) multiple sets of well designs in the subsurface volume of interest, and (iii) corresponding reservoir productivity values The computer-implemented method may also include obtaining an initial productivity algorithm to predict a reservoir productivity based on a production parameter and a well design. The computer-implemented method may further include generating a productivity algorithm by conditioning the initial productivity algorithm using the productivity training data. The computer-implemented method may also include obtaining multiple limited production parameter values. The computer-implemented method may further include obtaining multiple refined well designs. The computer-implemented method may further include generating multiple refined reservoir productivity values as a function of position in the subsurface volume of interest by applying the multiple refined well designs and multiple limited production parameter values to the productivity algorithm In implementations, a computer-implemented method may further include a graphical user interface. The computer-implemented method may include generating a representation of the refined reservoir productivity values as a function of position in the subsurface volume of interest using visual effects to depict at least a portion of the refined reservoir productivity values. The computer-implemented method may also include displaying the representation.

These and other features, and characteristics of the present technology, as well as the methods of operation and functions of the related elements of structure and the combination of parts and economies of manufacture, will become more apparent upon consideration of the following description and the appended Claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the presently disclosed technology. As used in the specification and in the Claims, the singular form of "a", "an", and "the" include plural referents unless the context clearly dictates otherwise.

The technology disclosed herein, in accordance with one or more various implementations, is described in detail with reference to the following figures. The drawings are provided for purposes of illustration only and merely depict typical or example implementations of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

BRIEF DESCRIPTION OF THE DRAWINGS

FIG. 2A illustrates example training for a parameter model, in accordance with some implementations.

FIG. 6A shows example map results of estimated reservoir productivity over a 12 month interval, in accordance with some implementations.

FIG. 6B shows example map results of estimated reservoir productivity over a 12 month interval, in accordance with some implementations.

FIG. 6C shows example map results of estimated reservoir productivity over a 12 month interval, in accordance with some implementations.

FIG. 6D shows example map results of estimated reservoir productivity over a 12 month interval, in accordance with some implementations.

FIG. 8 is an example output of the disclosed technology, in accordance with one or more implementations, in accordance with some implementations.

FIG. 18 is an example output of the disclosed technology, in accordance with one or more implementations, in accordance with some implementations.

DETAILED DESCRIPTION

Figure 1A:
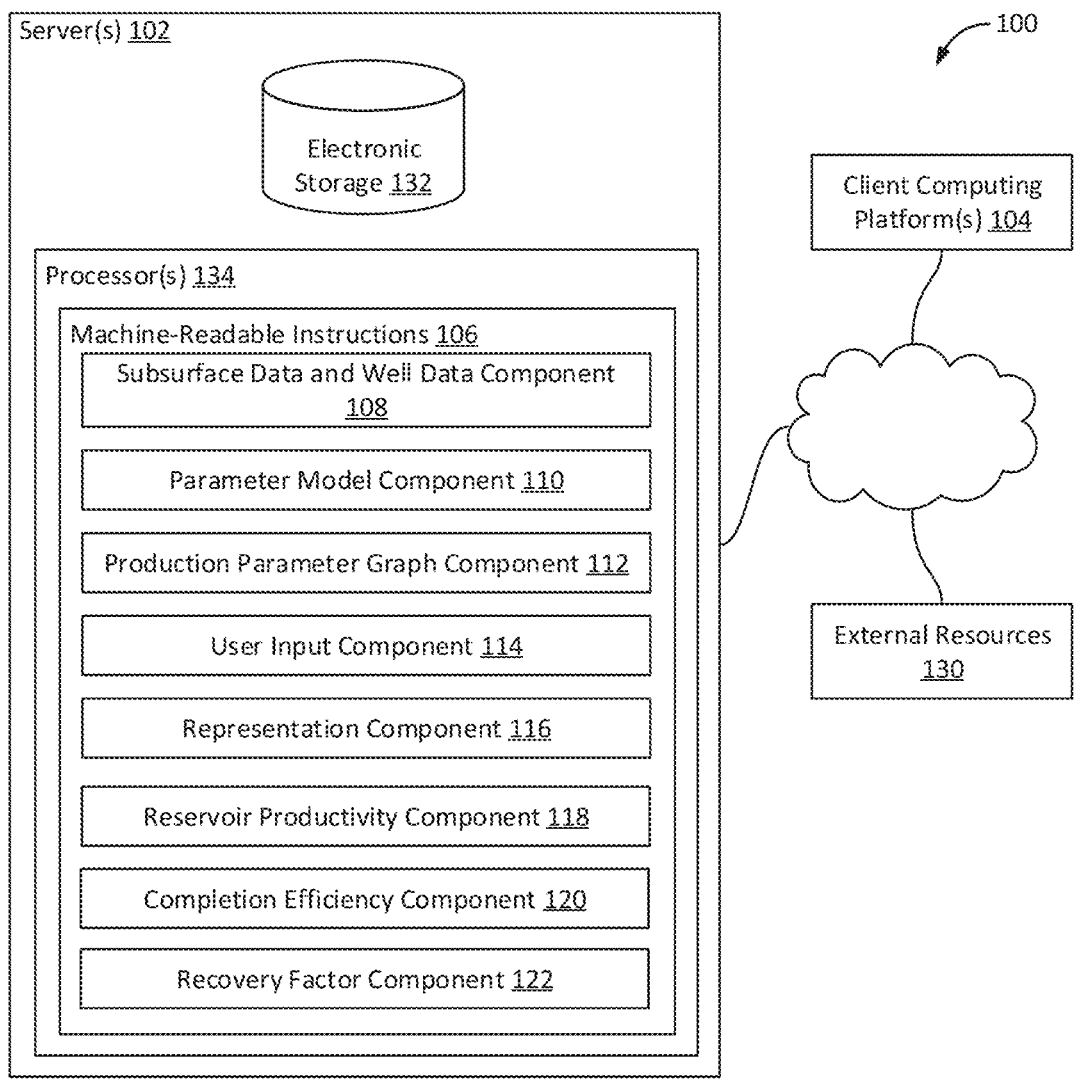
FIG. 1A shows a system configured for generating refined reservoir productivity values as a function of position in a subsurface volume of interest, in accordance with one or more implementations.

Well planning in hydrocarbon reservoirs may require characterization of the reservoir, including an understanding of the rock properties. Previous approaches for pay characterization often focus on hydrocarbon storage capability or may rely on inferential relationships to well productivity. More recent approaches may utilize simple linear and non-linear multivariate regression techniques to characterize the relationship between rock properties, completion strategies, and well production performance, but these methods may be prone to overfitting, have difficulty capturing complex interaction structures in noisy reservoir data, and generally fall short of characterizing the rock properties that may correspond to enhanced production performance. Existing technologies may not account for variable and/or refined well designs to estimate a reservoir productivity based on different parameters (e.g., economic concerns, physical reservoir limits, etc.). Existing technologies also fail to effectively predict appropriate well design, completion design, reservoir productivity, completion efficiency, and/or recovery factors, including for unconventional reservoirs.

There exists a need for improved characterization of subsurface reservoirs that may allow production predictions across the field as well as type curve generation.

Disclosed below are methods, systems, and computer readable storage media that may provide an estimation of reservoir productivity as a function of position in a subsurface volume of interest.

Disclosed below are methods, systems, and non-transitory computer-readable medium that may estimate a well design as a function of position in a subsurface volume of interest based on a reservoir productivity parameter.

Disclosed below are methods, systems, and non-transitory computer-readable medium that may estimate refined reservoir productivity values as a function of position in a subsurface volume of interest based on a refined well design.

Reference will now be made in detail to various implementations, examples of which are illustrated in the accompanying drawings. In the following detailed description, numerous details may be set forth in order to provide a thorough understanding of the present disclosure and the implementations described herein. However, implementations described herein may be practiced without such details. In other instances, some methods, procedures, components, and mechanical apparatuses may not be described in detail, so as not to unnecessarily obscure aspects of the implementations.

The presently disclosed technology includes implementations of a method and system for estimated reservoir productivity in a subsurface volume of interest, which may allow for better hydrocarbon exploration, prospect identification, development and economic planning, such as, for example, for unconventional and tight rock plays. In implementations, the presently disclosed technology may include estimating a well design as a function of position in a subsurface volume of interest based on a reservoir productivity parameter. A subsurface volume of interest may include any area, region, and/or volume underneath a surface. Such a volume may include, or be bounded by, one or more of a water surface, a ground surface, and/or other surfaces. The method may link key reservoir, completion, and development strategy (e.g. well spacing) characteristics with long-term well production using a predictive data analytic approach. The method may also be designed to quantify the expected recovery across subsurface volume of interest given historical correspondences between production and reservoir and completion practices. The method may further provide all the requisite output to construct predicted, synthetic type curves and perform decline analysis to determine an estimated reservoir productivity for any position in the subsurface volume of interest.

The presently disclosed technology may use multiple well designs from the subsurface volume of interest to determine a well design in a given position in the subsurface volume of interest based on a reservoir productivity parameter. Based on the reservoir productivity parameter, refined well designs may be generated. A representation of the refined well designs as a function of position may be generated using visual effects.

The presently disclosed technology may reduce uncertainty in the application of well designs and/or completion designs in unconventional plays subject to multivariate, multidimensional, and/or non-linear primary production drivers. The presently disclosed technology may link key reservoir characteristics with well production using quantile random forest machine learning. The presently disclosed technology may make iterative regression-based predictions of production at incrementally changing well designs and/or completions designs steps amongst a spatial array of locations in regular and/or irregular spacing across geographic space in an unconventional play. A best-fit regression function may be fitted to the changing production predictions for the incrementally changing well designs and/or completion designs at each of the prediction locations in the spatial array. The derivative of the function within the range of observations may result in the point of diminishing returns of well designs and/or completion designs given the rock conditions at that location in the unconventional play. The practitioner may be given the option to derive the point on the fitted function based on a completion cost-value basis, percent of maximum production recovery basis, and/or other factors. The completion limit points derived at the individual array locations can be collectively mapped or gridded into a map illustrating spatial trends in refined well designs and/or completion designs.

Using machine learning, an economically appropriate recovery of a reservoir may be predicted. The presently disclosed technology may identify the most efficient regions of a reservoir in terms of hydrocarbon recovery per completion size. The presently disclosed technology may enable direct calculation of hydrocarbon recovery factors and recovery factor maps based on machine-learned relationships between production, completion engineering, and reservoir properties. Previously, recovery factors between hydrocarbon geologically stored in an unconventional reservoir and that produced over the life of a well have been entirely inferential. The presently disclosed technology may resolve previous difficulties in estimating recovery factors for unconventional systems because the presently disclosed technology may provide strong spatial continuity and associate production to reservoir properties. The presently disclosed technology may match unconventional well completion designs to reservoir rock conditions grounded in their impact on production. For the presently disclosed technology, the completion limits may be applied to a machine learning algorithm that is trained to predict production from one or more completions, well engineering, and one or more reservoir property predictor variables. The resulting maps may be grids of refined expected hydrocarbon recovery. The refined expected hydrocarbon recovery grids can be further manipulated using spatial mathematics into reservoir completion efficiency maps. The reservoir completion efficiency maps may address value potential of a hydrocarbon producing unconventional basin and can be used to guide lease trades, exploration, and development activities. Furthermore, the refined expected recovery maps can be compared to hydrocarbon in place maps to generate expected recovery factor maps, previously unattainable. These maps can have significant impact on business economics and reserves planning in unconventional plays.

FIG. 1A illustrates a system 100 configured for estimating reservoir productivity as a function of position in a subsurface volume of interest, in accordance with one or more implementations. In implementations, system 100 may estimate one or more well designs for a reservoir productivity as a function of position in the subsurface volume of interest. In implementations, system 100 may be configured to estimate refined reservoir productivity values as a function of position in the subsurface volume of interest. In some implementations, system 100 may include one or more servers 102. Server(s) 102 may be configured to communicate with one or more client computing platforms 104 according to a client/server architecture and/or other architectures. Client computing platform(s) 104 may be configured to communicate with other client computing platforms via server(s) 102 and/or according to a peer-to-peer architecture and/or other architectures. Users may access system 100 via client computing platform(s) 104.

Server(s) 102 may be configured by machine-readable instructions 106. Machine-readable instructions 106 may include one or more instruction components. The instruction components may include computer program components. The instruction components may include one or more of a subsurface data and well data component 108, a parameter model component 110, a production parameter graph component 112, a user input component 114, a representation component 116, and/or other instruction components.

Subsurface data and well data component 108 may be configured to obtain, from the non-transient electronic storage, subsurface data and well data corresponding to a subsurface volume of interest. The subsurface data and/or the well data may be obtained from the non-transient electronic storage and/or other sources. The subsurface data and the well data may include production parameter values for multiple production parameters as a function of position in the subsurface volume of interest, thereby characterizing subsurface production features that affect the reservoir productivity. Reservoir productivity may include the amount of extractable hydrocarbons in the reservoir.

The subsurface data and the well data may be filtered by one or more pay zones. The subsurface data may include geological data and reservoir data. Geological data may include petrophysical, core, cutting, pressure, drilling property, mudlog, seismic properties, and/or other geological data. In implementations, for unconventional reservoirs, this may include an anticipated stimulated rock volume, a natural geologic target zone, or even a gross formation interval. In some implementations, reservoir data may be interpolated using cokriging, autocorrelation gridding techniques, and/or other techniques. Well data may include completion data and production data. Completion data may include well perforation lengths, proppant intensity, fluid types, well spacing, number of frac stages, and/or other completion data. Production data may include cumulative oil, gas, and/or water production at different time intervals, such as, for example, 6 month or 18 month cumulative standard barrels of oil equivalent produced.

By way of non-limiting example, the subsurface production features may include one or more petrophysical, core, cutting, pressure, drilling property, mudlog, seismic features, well perforation lengths, proppant intensity, fluid types, well spacing, number of fracturing stages, cumulative oil production over a time interval, cumulative gas production over a time interval, cumulative water production over a time interval, and/or other features.

Subsurface data and well data component 108 may be configured to use the subsurface data and the well data to generate multiple production parameter maps. This may be accomplished by one or more physical computer processors. A given production parameter map may represent the production parameter values for a given production parameter as a function of time and position in the subsurface volume of interest.

In implementations, production parameter values may be filtered based on statistical significance and/or collinearity using, for example, a Pearson correlation matrix.

Subsurface data and well data component 108 may be configured to obtain multiple well designs. An individual well design may include multiple design parameters. An individual well design may specify multiple design parameter values for an individual design parameter. The design parameters may include a completion size, a proppant parameter value, a fracture fluid parameter value, a reservoir pressure parameter value, a porosity parameter value, a well spacing parameter, a well pump rate parameter, a casing perforation parameter, a perforation cluster spacing parameter, a completion stage length parameter, and/or other design parameters. Design parameters may include parameters that relate to well design, completion design, and/or other parameters.

In implementations, subsurface data and well data component 108 may be configured to obtain refined well designs. Refined well designs may correspond to well designs parameterized by a reservoir productivity parameter, as will be described herein.

Parameter model component 110 may be configured to obtain a parameter model. The parameter model may be obtained from the non-transient electronic storage and/or other sources. The parameter model may be trained using training data on an initial parameter model. The training data may include well data and the production parameter values for corresponding multiple production parameters affecting productivity of the one or more wells as a function of position in the subsurface volume of interest. The parameter model may include random forest machine learning and/or other machine learning.

Figure 2B:
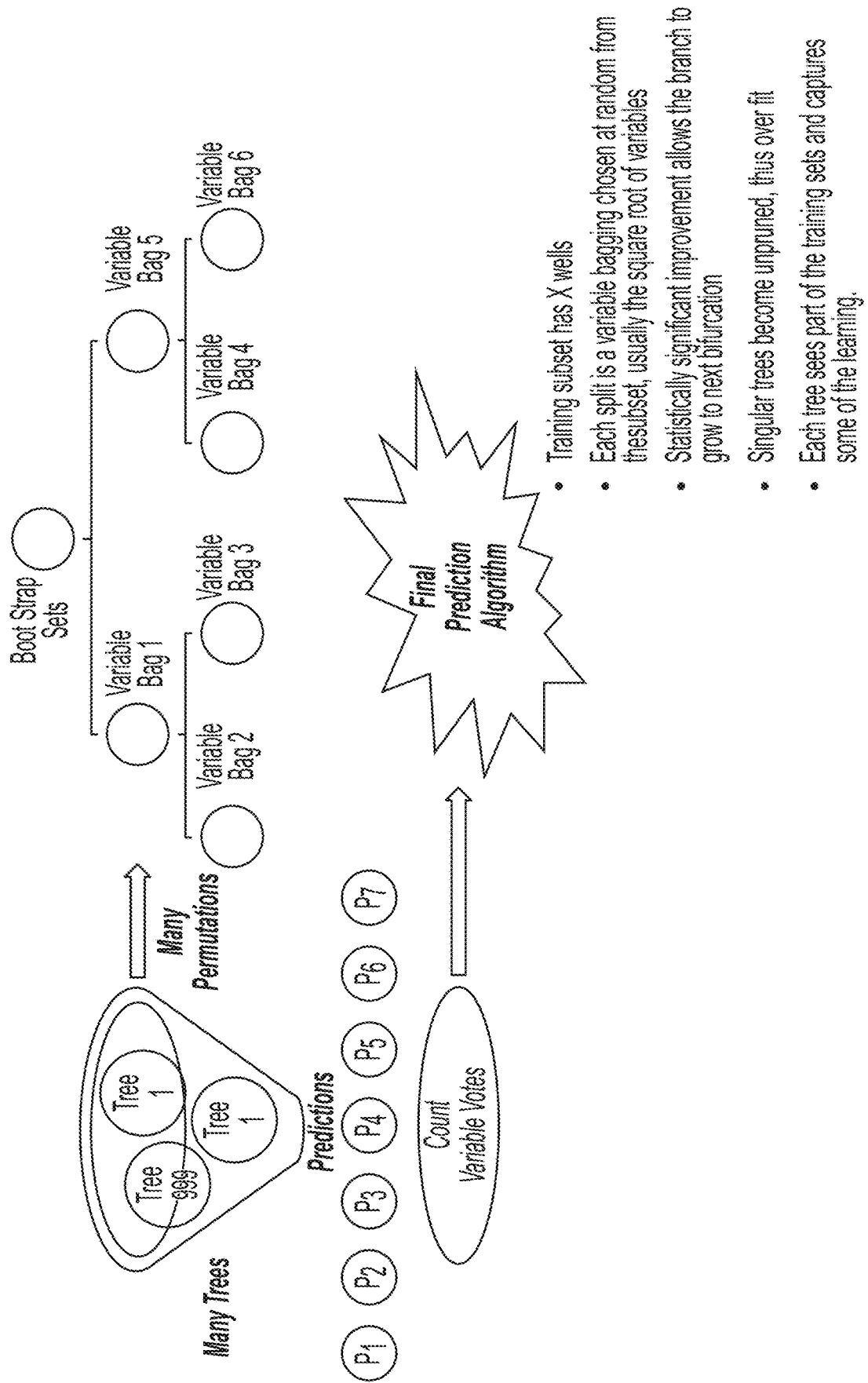
FIG. 2B illustrates example training for a parameter model, in accordance with some implementations.
Figure 2C:
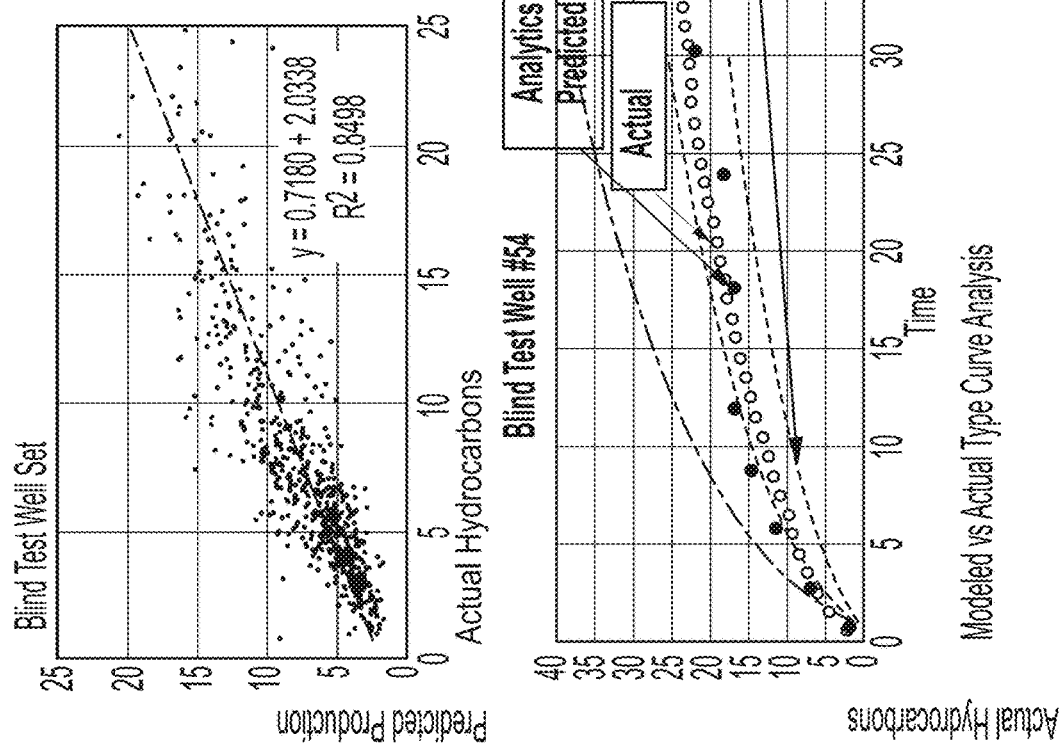
FIG. 2C illustrates example training for a parameter model, in accordance with some implementations.

For example, FIGS. 2A, 2B, and 2C illustrate example training for a parameter model, in accordance with some implementations. Referring to FIG. 2A, the parameter model may include random forest machine learning. Random forest machine learning may have a low risk of overfitting, may allow extreme randomization, and may be very iterative. Random forest may be a modification of bootstrap aggregation that builds on a large collection of de-correlated regression trees and then averages them. Bootstrap aggregation may average many noisy but unbiased models to reduce prediction variance. Regression trees may be appropriate for bootstrap aggregation, because they can capture complex interaction structure. Referring to FIG. 2B, the random forest machine learning uses many boot strap sets and many regression trees to generate many predictions, ultimately averaged together to provide the final prediction algorithm. This may identify the most impactful and statistically significant predictor production parameters that account for differences in well production. Referring to FIG. 2C, applying the parameter model to the multiple refined production parameter maps may allow for validation of the analytic model via blind testing.

Referring to FIG. 1A, parameter model component 110 may be configured to apply the parameter model to the multiple production parameter maps to generate multiple refined production parameters including refined production parameter values. This may be accomplished by the one or more physical computer processors. The refined production parameters may be a subset of the multiple production parameters. In some implementations, the subset may include the set itself. The parameter model may have been trained, as described herein, to identify one or more of the multiple production parameters that have the greatest effect on productivity compared to the other multiple production parameters.

In implementations, a Boruta plot may be generated from the random forest model using the refined production parameters and corresponding refined production parameter values.

Parameter model component 110 may be configured to obtain an initial productivity algorithm configured to receive multiple well designs, corresponding reservoir productivity values as a function of position in the subsurface volume of interest, and/or reservoir characteristics of the subsurface volume of interest. The initial productivity algorithm may roughly estimate reservoir productivity as a function of position in the subsurface volume of interest based on the input described above. In implementations, the initial productivity algorithm may be trained using refined training data as a function of position in the subsurface volume of interest.

Parameter model component 110 may be configured to apply the productivity algorithm to the multiple well designs as a function of position to generate multiple productivity values specifying an estimated productivity for a given well design as a function of position. The productivity may be a reservoir productivity.

Parameter model component 110 may be configured to generate the productivity algorithm by conditioning the initial productivity algorithm using well design training data. The well design training data may include refined production parameter values, multiple sets of multiple well designs, the reservoir characteristics of the subsurface volume of interest, and/or the corresponding reservoir productivity values in the subsurface volume of interest. Using machine learning, initial productivity algorithm may be conditioned to more accurately predict a reservoir productivity value given multiple well designs in the subsurface volume of interest and the reservoir characteristics of the subsurface volume of interest as input and using the actual productivity in the reservoirs as a guide to improve predictions. The productivity algorithm may output an estimated productivity based on a given well design. In some implementations, the multiple well designs and the corresponding estimated productivity values may form a distribution. The best-fit function may be a best-fit curve through the distribution of the input and output of the productivity algorithm. In implementations, one or more production parameter values and a refined well design (e.g., based on one or more reservoir productivity parameters) may be applied to the productivity algorithm to provide a corresponding refined reservoir productivity value. It should be appreciated that multiple refined well designs may be used to generate multiple refined reservoir productivity values as a function of position in the subsurface volume of interest.

In implementations, parameter model component 110 may be configured to parameterize the best-fit function based on a reservoir productivity parameter. The parameterization may include deriving the best-fit function. The derivation may be based on user input selecting a reservoir productivity parameter. The reservoir productivity parameter may include a completion limit, a diminishing point of returns, a cost-value threshold value, a maximum recovery threshold value, and/or other parameters. For example, the reservoir productivity parameter may be an economical point of return, a cost-value limit, a percent of maximum production recovery basis, etc. Based on the reservoir productivity parameter, a refined well design may be selected. The refined well design may be stored. For example, the economical point of return may be somewhere along the start and the end point of the best-fit curve. The economical point of diminishing return on the best-fit curve may indicate what the corresponding refined well design is to achieve such an economical point of return. In another example, the maximum recovery threshold value may be the highest point on the best-fit curve. The maximum recovery threshold value on the best-fit curve may indicate what the corresponding refined well design is to achieve the maximum recovery.

Production parameter graph component 112 may be configured to generate multiple refined production parameter graphs from the refined production parameter values. A given refined production parameter graph may specify the refined production parameter values for a corresponding production parameter as a function of estimated reservoir productivity. This may be accomplished by the one or more physical computer processors.

Production parameter graph component 112 may be configured to display the multiple refined production parameter graphs. The multiple refined production parameter graphs may be displayed on a graphical user interface and/or other displays.

In implementations, production parameter graph component 112 may be configured to determine or identify trends, thresholds, and/or other conditions to limit the refined production parameter values using linear analysis, non-linear analysis, rate of change analysis, machine learning, and/or other techniques.

User input component 114 may be configured to generate one or more user input options to limit the refined production parameter values corresponding to individual ones of the multiple refined production parameters. This may be accomplished by the one or more physical computer processors. By way of non-limiting example, user input options may include a window input for text, numbers, and/or symbols; options to select greater than, greater than or equal to, less than, and/or less than or equal to; note a trend of increasing values, a trend of decreasing values; note a linear trend, a non-linear trend, and/or other trends, options to select one or more threshold values; and/or other trends. In implementations, user input options may include defining a well design and/or completion design. A well design may include design parameters used to extract hydrocarbons from a reservoir.

User input component 114 may be configured to present the one or more user input options corresponding to the multiple refined production parameters. The one or more user input options may be displayed on a graphical user interface and/or other displays.

User input component 114 may be configured to receive a defined well design and the one or more user input options selected by a user to limit the refined production parameter values corresponding to the multiple refined production parameter graphs to generate limited production parameter values. The defined well design may describe the design parameters for extracting hydrocarbons, as described above. The limited production parameter values may be a subset of the refined production parameter values. In some implementations, the subset may be the set itself. As described herein, the limited production parameter values may be limited based on the thresholds and/or trends of the multiple refined production parameter graphs identified by the system or by a user through the user input options.

User input component 114 may be configured to present the one or more user input options corresponding to the reservoir productivity parameter. The one or more user input options may include an option to select a cost-value option, an economical point of return, a cost-value limit, a maximum production recovery basis, etc. Upon selecting one of the above options, an text input box may be presented to input a given value for the option. For example, for maximum production recovery basis, a user may input 100%, 70%, or any number between 0 and 100%. The one or more user input options may be displayed on a graphical user interface and/or other displays.

User input component 114 may be configured to receive the user input corresponding to the reservoir productivity parameter.

Representation component 116 may be configured to generate a representation of estimated reservoir productivity as a function of position in the subsurface volume of interest using the defined well design and visual effects to depict at least a portion of the limited production parameter values, based on the one or more user input options selected. This may be accomplished by the one or more physical computer processors. The representation may estimate a productivity of one or more pay zones of a reservoir in the subsurface volume of interest. The representation may change as a function of time.

In some implementations, a visual effect may include one or more visual transformation of the representation. A visual transformation may include one or more visual changes in how the representation is presented or displayed. In some implementations, a visual transformation may include one or more of a visual zoom, a visual filter, a visual rotation, and/or a visual overlay (e.g., text and/or graphics overlay).

Representation component 116 may be configured to generate a representation of a well design as a function of position in the subsurface volume of interest based on a reservoir productivity parameter using visual effects to depict at least a portion of the multiple refined design parameter values. In implementations, the refined well designs may be based on the one or more user input options selected, as described above. For example, to extract a maximum productivity, a well design may be generated that optimizes extraction of every hydrocarbon in the reservoir. In one example, user input may be related to a cost value, so the least costly well design may be generated to extract the most hydrocarbons from the reservoir.

Representation component 116 may be configured to generate a representation of refined reservoir productivity as a function of position in the subsurface volume of interest using visual effects to depict at least a portion of the multiple refined reservoir productivity values. The representation may use a temperature map, or other color coding, to indicate which positions in the subsurface volume of interest have higher or lower refined reservoir productivity values to help more easily identify valuable regions in the subsurface volume of interest.

Representation component 116 may be configured to generate a representation of completion efficiency as a function of position in the subsurface volume of interest using visual effects to depict at least a portion of the multiple completion efficiency values. The representation may use a temperature map, or other color coding, to indicate which positions in the subsurface volume of interest have higher or lower completion efficiency values to help more easily identify valuable regions in the subsurface volume of interest.

Representation component 116 may be configured to generate a representation of recovery factor as a function of position in the subsurface volume of interest using visual effects to depict at least a portion of the multiple recovery factor values. The representation may use a temperature map, or other color coding, to indicate which positions in the subsurface volume of interest have higher or lower recovery factor values to help more easily identify valuable regions in the subsurface volume of interest.

Representation component 116 may be configured to display the one or more representations. The one or more representations may be displayed on a graphical user interface and/or other displays.

Reservoir productivity component 118 may be configured to generate predicted reservoir productivity values. In implementations, the productivity algorithm may use a well design and one or more production parameter values from one or more production parameters to generate reservoir productivity values. For example, a refined well design and refined production parameter values from different refined production parameters may be used to predict refined reservoir productivity values.

Completion efficiency component 120 may be configured to generate completion efficiency values. A completion efficiency value may be based on a refined reservoir productivity value and a corresponding refined well design. For example, the completion efficiency value may be determined by dividing a refined reservoir productivity value with a refined well design as a function of position in the subsurface volume of interest. Individual ones of the multiple completion efficiency values may specify an amount of oil recovered based on a completion design. In other words, the completion efficiency value may be a ratio between the refined reservoir productivity values and corresponding well designs. The completion to productivity ratio may be an indicator for the value of a portion of a hydrocarbon producing basin. In some examples, the completion efficiency values may specify the profits and/or costs expected as a function of position in the subsurface volume of interest. The profits may be based on an expected price of hydrocarbons, a current price of hydrocarbons, and/or other profits. The costs may be based on building a well, drilling into the subsurface volume of interest, processing the hydrocarbons, and/or other costs.

Recovery factor component 122 may be configured to generate recovery factor values. Generating recovery factor values may include generating multiple storage volumes as a function of position in the subsurface volume of interest. A storage volume may refer to a total amount of hydrocarbon in the subsurface volume of interest as a function of position. For example, the storage volume may be generated by taking a saturated oil porosity height and multiplying it by a horizontal spacing factor. In another example, the storage volume may be generated based on the porosity of a subsurface feature (e.g., rock), the proportion of the subsurface feature that is hydrocarbon filled, and a thickness of the subsurface feature layer. It should be appreciated that other existing methods may be used to generate the storage volume. Generating recovery factor values may include generating the multiple recovery factor values based on the refined reservoir productivity values and the storage volumes as a function of position in the subsurface volume of interest. For example, the recovery factor may be generated by dividing the refined reservoir productivity values with the storage volume as a function of position in the subsurface volume of interest. Individual ones of the multiple recovery factor values may specify a percentage of hydrocarbons extracted compared to the total amount of hydrocarbons stored as a function of position in the subsurface volume of interest.

In some implementations, server(s) 102, client computing platform(s) 104, and/or external resources 130 may be operatively linked via one or more electronic communication links. For example, such electronic communication links may be established, at least in part, via a network such as the Internet and/or other networks. It will be appreciated that this is not intended to be limiting, and that the scope of this disclosure includes implementations in which server(s)

102, client computing platform(s) 104, and/or external resources 130 may be operatively linked via some other communication media.

A given client computing platform 104 may include one or more processors configured to execute computer program components. The computer program components may be configured to enable an expert or user associated with the given client computing platform 104 to interface with system 100 and/or external resources 130, and/or provide other functionality attributed herein to client computing platform(s) 104. By way of non-limiting example, the given client computing platform 104 may include one or more of a desktop computer, a laptop computer, a handheld computer, a tablet computing platform, a NetBook, a Smartphone, a gaming console, and/or other computing platforms.

External resources 130 may include sources of information outside of system 100, external entities participating with system 100, and/or other resources. In some implementations, some or all of the functionality attributed herein to external resources 130 may be provided by resources included in system 100.

Server(s) 102 may include electronic storage 132, one or more processors 134, and/or other components. Server(s) 102 may include communication lines, or ports to enable the exchange of information with a network and/or other computing platforms. Illustration of server(s) 102 in FIG. 1A is not intended to be limiting. Server(s) 102 may include a plurality of hardware, software, and/or firmware components operating together to provide the functionality attributed herein to server(s) 102. For example, server(s) 102 may be implemented by a cloud of computing platforms operating together as server(s) 102.

Electronic storage 132 may comprise non-transient electronic storage and/or non-transitory storage media that electronically stores information. The electronic storage media of electronic storage 132 may include one or both of system storage that is provided integrally (i.e., substantially non-removable) with server(s) 102 and/or removable storage that is removably connectable to server(s) 102 via, for example, a port (e.g., a USB port, a firewire port, etc.) or a drive (e.g., a disk drive, etc.). Electronic storage 132 may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. Electronic storage 132 may include one or more virtual storage resources (e.g., cloud storage, a virtual private network, and/or other virtual storage resources). Electronic storage 132 may store software algorithms, information determined by processor(s) 134, information received from server(s) 102, information received from client computing platform(s) 104, and/or other information that enables server(s) 102 to function as described herein.

Processor(s) 134 may be configured to provide information processing capabilities in server(s) 102. As such, processor(s) 134 may include one or more of a physical computer processor, a digital processor, an analog processor, a digital circuit designed to process information, an analog circuit designed to process information, a state machine, and/or other mechanisms for electronically processing information. Although processor(s) 134 is shown in FIG. 1A as a single entity, this is for illustrative purposes only. In some implementations, processor(s) 134 may include a plurality of processing units. These processing units may be physically located within the same device, or processor(s) 134 may represent processing functionality of a plurality of devices operating in coordination. Processor(s) 134 may be configured to execute components 108, 110, 112, 114, and/or 116, and/or other components. Processor(s) 134 may be configured to execute components 108, 110, 112, 114, and/or 116, and/or other components by software; hardware; firmware; some combination of software, hardware, and/or firmware; and/or other mechanisms for configuring processing capabilities on processor(s) 134. As used herein, the term "component" may refer to any component or set of components that perform the functionality attributed to the component. This may include one or more physical processors during execution of processor readable instructions, the processor readable instructions, circuitry, hardware, storage media, or any other components.

It should be appreciated that although components 108, 110, 112, 114, and/or 116 are illustrated in FIG. 1A as being implemented within a single processing unit, in implementations in which processor(s) 134 includes multiple processing units, one or more of components 108, 110, 112, 114, and/or 116 may be implemented remotely from the other components. The description of the functionality provided by the different components 108, 110, 112, 114, and/or 116 described below is for illustrative purposes, and is not intended to be limiting, as any of components 108, 110, 112, 114, and/or 116 may provide more or less functionality than is described. For example, one or more of components 108, 110, 112, 114, and/or 116 may be eliminated, and some or all of its functionality may be provided by other ones of components 108, 110, 112, 114, and/or 116. As an example, processor(s) 134 may be configured to execute one or more additional components that may perform some or all of the functionality attributed below to one of components 108, 110, 112, 114, and/or 116.

Figure 1B:
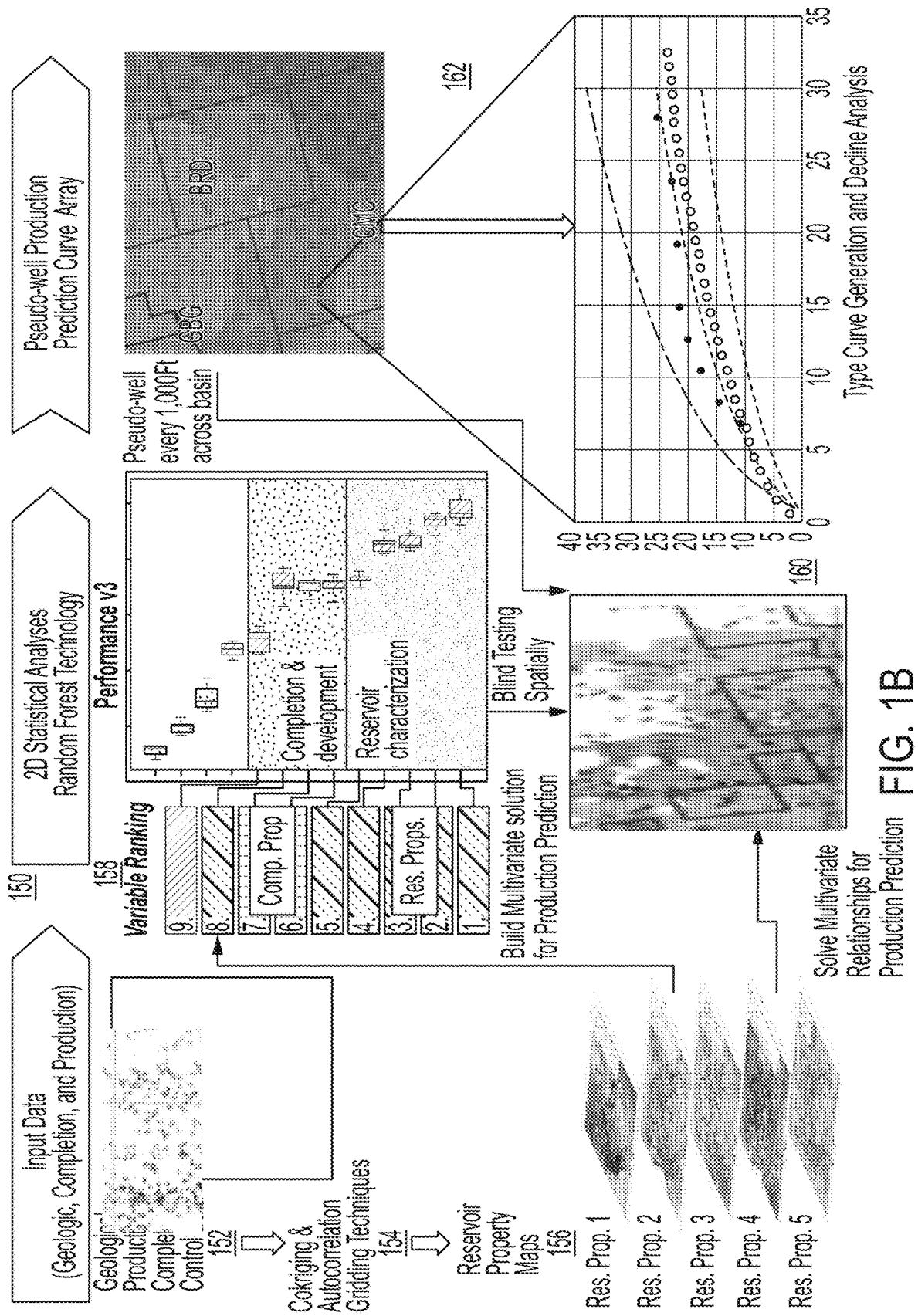
FIG. 1B illustrates a flowchart of a method of hydrocarbon reservoir recoverable pay characterization, in accordance with some implementations.

FIG. 1B illustrates a flowchart 150 of a method for pay characterization of a subterranean hydrocarbon reservoir. The left column shows input data 152, which may include subsurface data and well data, as described above. Input data 152 may have corresponding production parameters characterizing subsurface production features, such as, for example, well attributes, as a function of position in the subsurface volume of interest. The subsurface data and the well data may be used to generate multiple production parameter maps (e.g., reservoir property maps). Geological data may be gridded. Gridding methods 154, such as, for example, cokriging may provide measurable uncertainty due to interpolation in the form of standard error maps. The standard error maps may be useful for considering the inclusion of a production parameter into the parameter model (e.g., random forest algorithm) of the workflow. Multiple production parameters maps or reservoir property maps 156 may include, at a minimum, average porosity, pore saturation, mineralogy, lithofacies, geomechanical properties, organic richness, and/or any other reservoir property.

Production parameter maps 156 may be subjected to a parameter model, such as, for example, a 2D statistical analysis 158. In particular, a random forest algorithm may be used, as described herein. Using the parameter model with the multiple production parameter maps may allow for validation of the parameter model via blind testing. Applying the parameter model to the production parameter values may generate representations 160. Individual pseudo wells, or an estimated reservoir productivity, may be in the representation as a function of position in the subsurface volume of interest maps and time. A given well may be subjected to a type curve generation and decline analysis 162. The type curve generation and decline analysis 164 may identify a productivity as a function of time.

Figure 3:
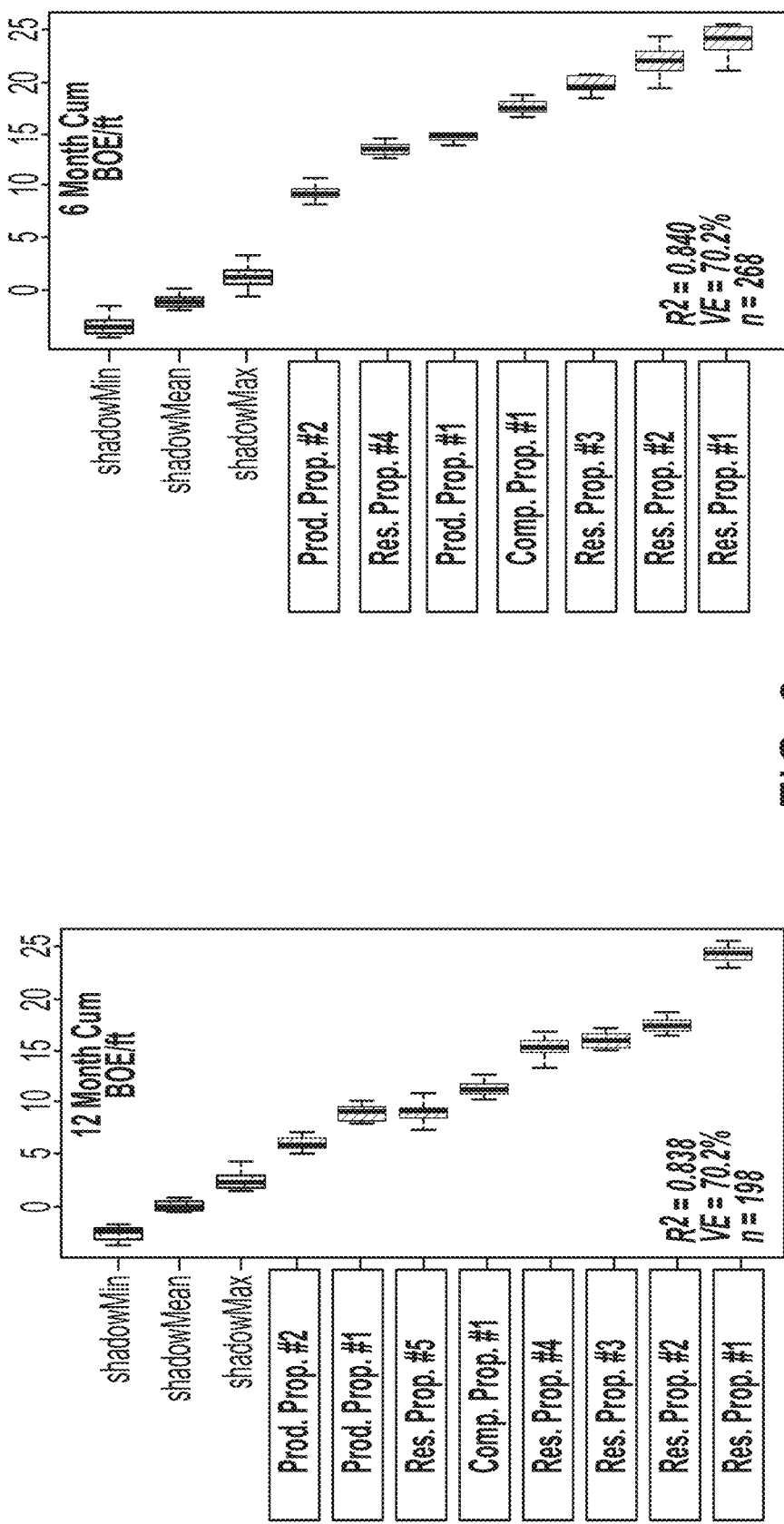
FIG. 3 illustrates example Boruta plots identifying an effect production parameters may have on estimated reservoir productivity, in accordance with one or more implementations.

FIG. 3 illustrates example Boruta plots identifying an effect production parameters may have on estimated reservoir productivity, in accordance with one or more implementations. As illustrated, production parameters closer to the right side indicate a larger effect a given production parameter has on estimated reservoir productivity. These production parameters may have been identified by the parameter model as being critical to the prediction of production, as they may tend to more frequently lead to more robust correlations in individual regression trees when they are included randomly. Similar ensembles of production parameters may be used to predict each incremental time interval of cumulative production to build a spatial array of prediction locations that have all of the incremental production volumes associated. The production parameter on the bottom (e.g., Res. Prop. #1) may have the greatest effect, Res. Prop. #2 may have the second greatest effect, Res. Prop #3 may have the third greatest effect, and so on. The effect of the multiple production parameters may change as a function of time. For example, the Boruta plot on the left indicates that Res. Prop #4 has a greater effect at 12 months than at 6 months. The Boruta plot on the left indicates that Comp. Prop #1 has the fifth greatest effect on estimated reservoir productivity at 12 months and has the fourth greatest effect on estimated reservoir productivity at 6 months.

Figure 4:
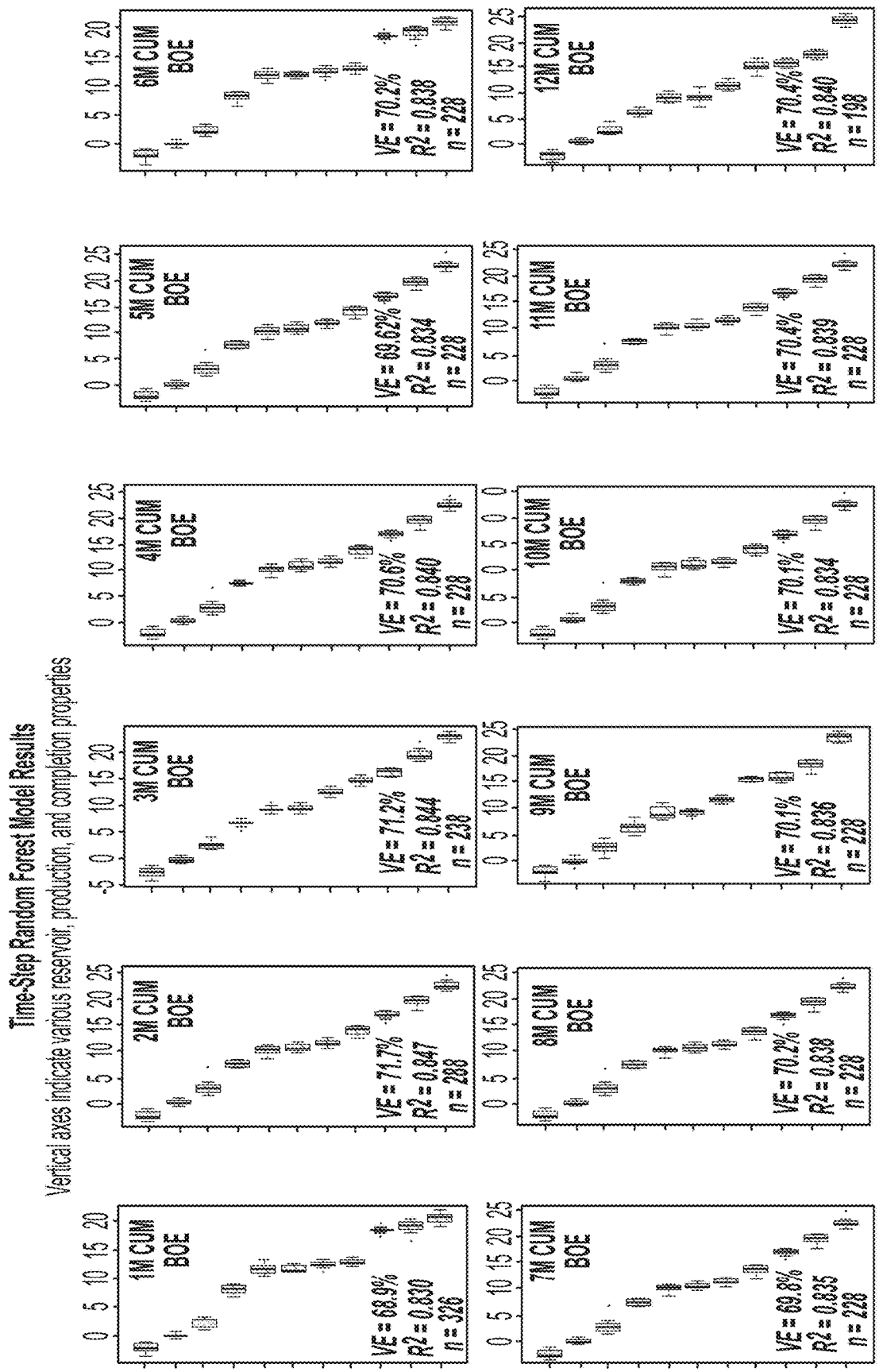
FIG. 4 illustrates example Boruta plots identifying an effect production parameters may have on estimated reservoir productivity by month, in accordance with one or more implementations.

FIG. 4 illustrates example Boruta plots identifying an effect production parameters may have on estimated reservoir productivity by month, in accordance with one or more implementations.

Figure 5:
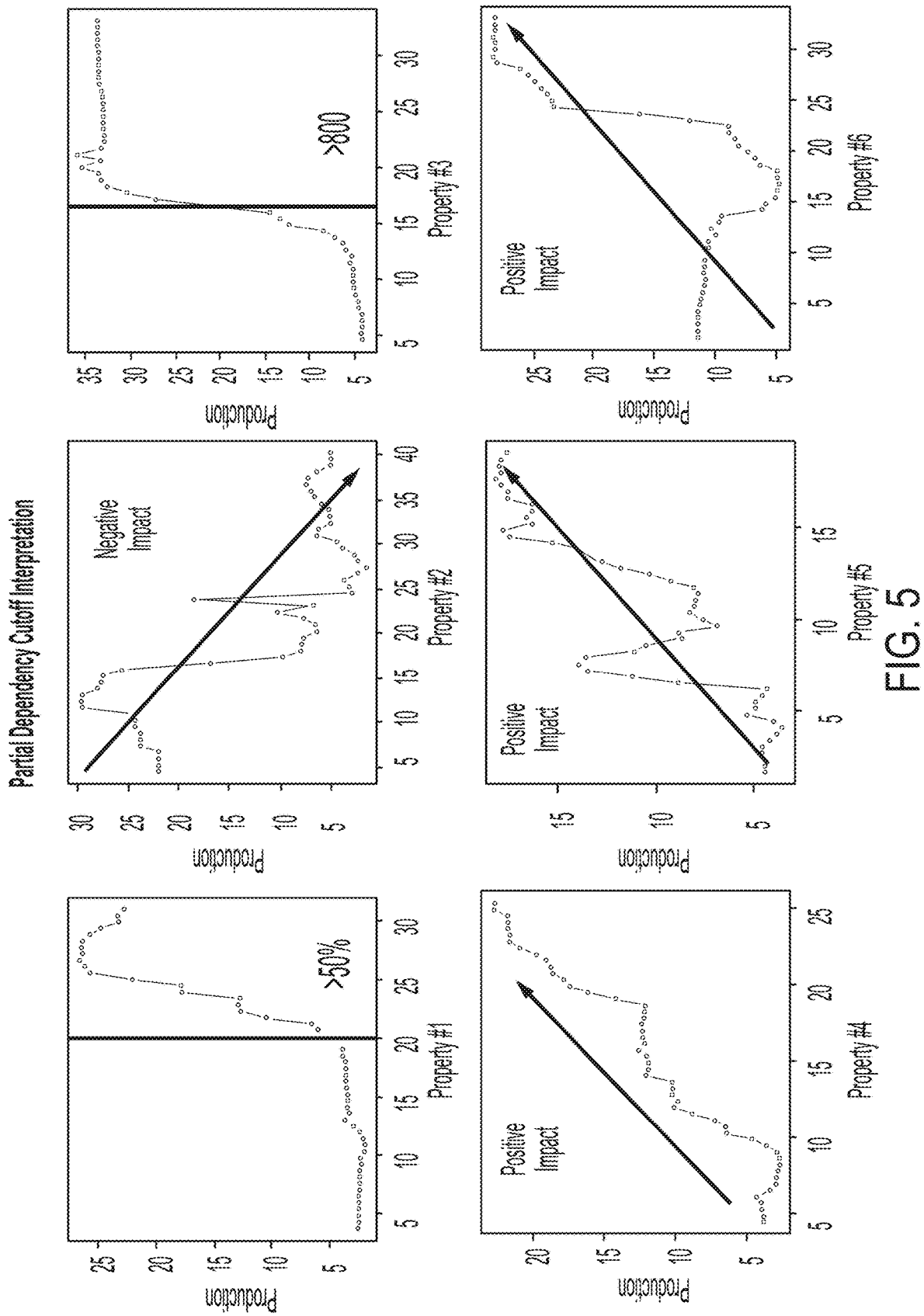
FIG. 5 illustrates example production parameter graphs, in accordance with one or more implementations.

FIG. 5 illustrates example production parameter graphs, in accordance with one or more implementations. These production parameter values may indicate the marginal effect of a given production parameter on estimated reservoir productivity. The interpretations can be used as a manual check by a subject matter expert to ensure that a given production parameter has a realistic effect on well performance prediction. Spurious or illogical production parameter graphs may indicate under- or miss-sampling. Meaningful production parameters may be used to make regression-based predictions of estimated reservoir productivity at incremental time intervals as a function of position in a subsurface volume of interest. The estimated reservoir productivity may be transformed into incremental production rates and subjected to traditional decline curve analysis. As illustrated, property #1 and property #3 have a threshold value above which refined production parameter values may be limited. Property #4, Property #5, and Property #6 may indicate an increasing level of productivity as the corresponding production parameter values increase. Property #2 may indicate a decreasing level of productivity as the production parameter values increase.

Figure 7A:
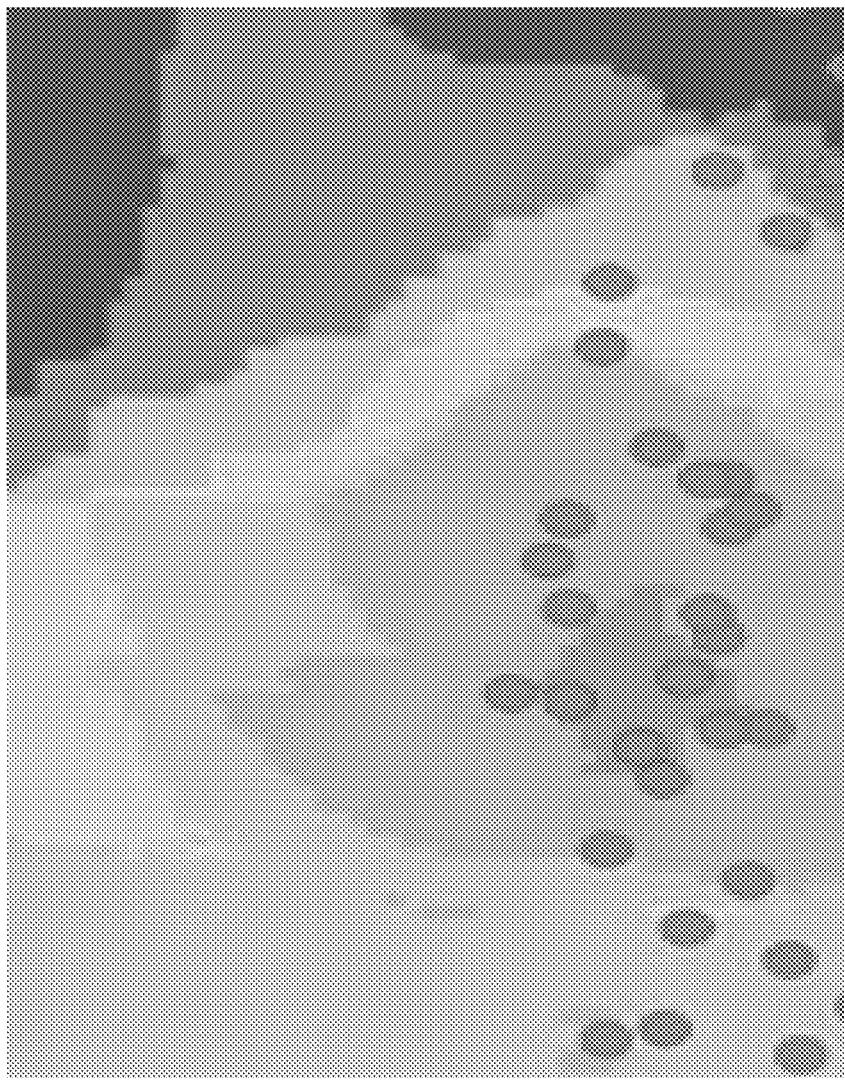
FIG. 7A illustrates example type curve generation and decline analyses used to estimate reservoir productivity compared to actual productivity, in accordance with some implementations.
Figure 7B:
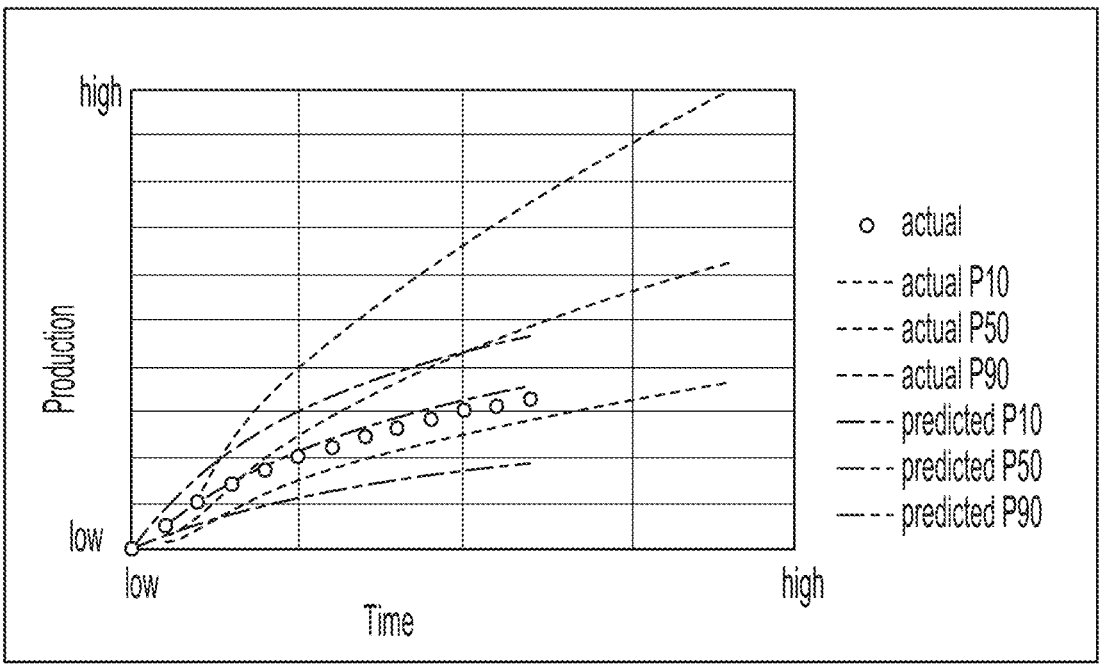
FIG. 7B illustrates example type curve generation and decline analyses used to estimate reservoir productivity compared to actual productivity, in accordance with some implementations.
Figure 7C:
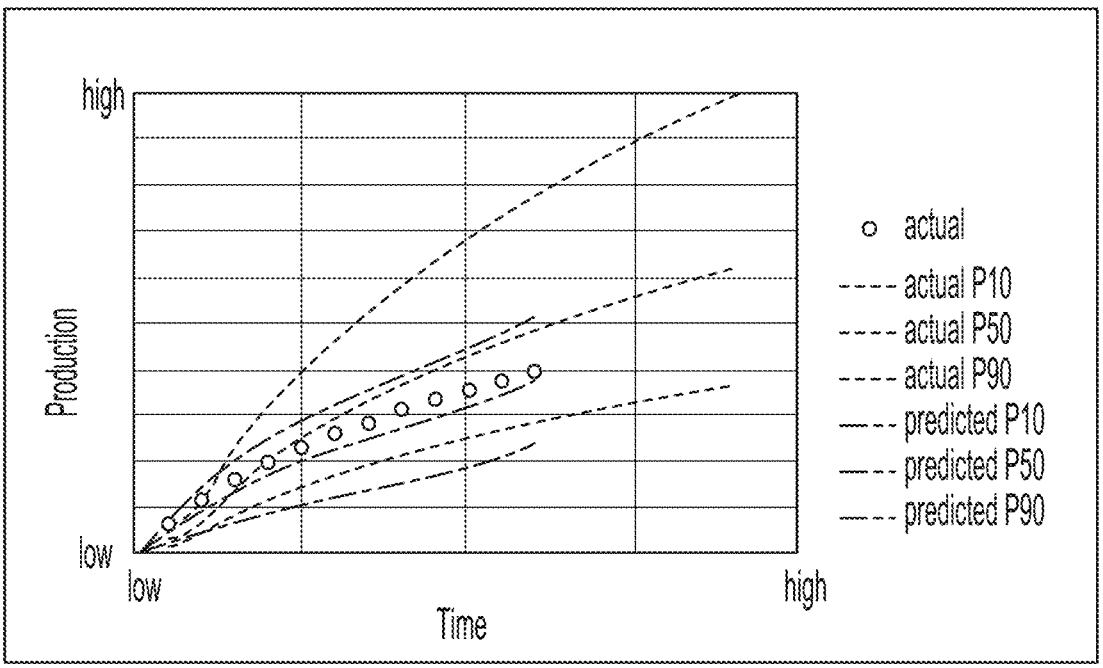
FIG. 7C illustrates example type curve generation and decline analyses used to estimate reservoir productivity compared to actual productivity, in accordance with some implementations.

FIGS. 6A, 6B, 6C, and 6D show example map results of estimated reservoir productivity over a 12 month interval. FIGS. 7A, 7B, and 7C illustrate example type curve generation and decline analyses used to estimate reservoir productivity compared to actual productivity. Individual type curve generation and decline analyses may correspond to differently defined well designs.

Figure 8:
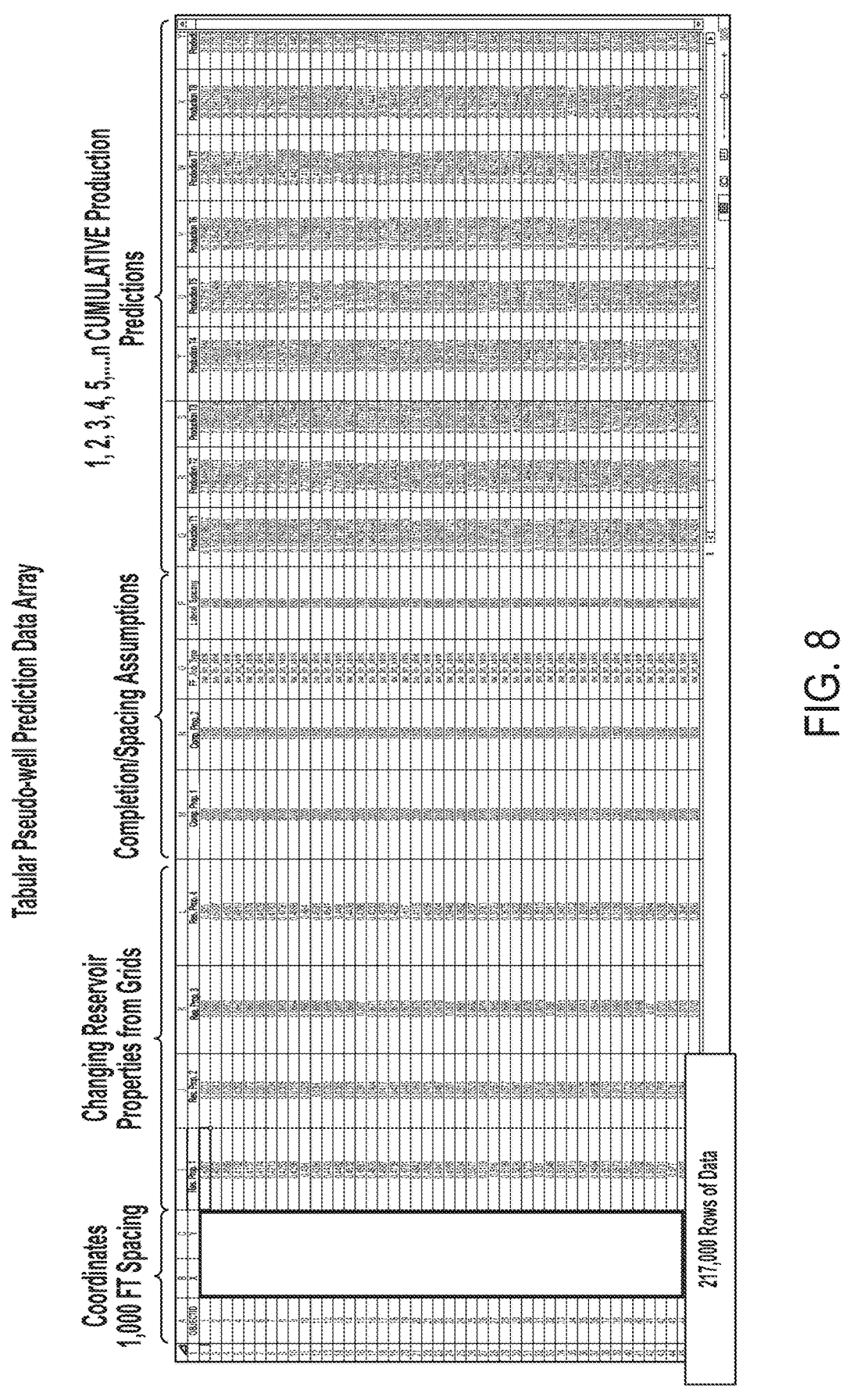

FIG. 8 is an example output of the disclosed technology, in accordance with one or more implementations. As illustrated, the size of the spatial array may include about 217,000 positions with an estimated reservoir productivity at each position. It should be appreciated that there are no inherent limitations to the spacing of the array, nor the temporal resolution of the cumulative production predictions tied to each array location. The output may include coordinates, production parameter values, a defined well design, cumulative estimated reservoir productivity in multiple time intervals, and/or other items.

Figure 9:
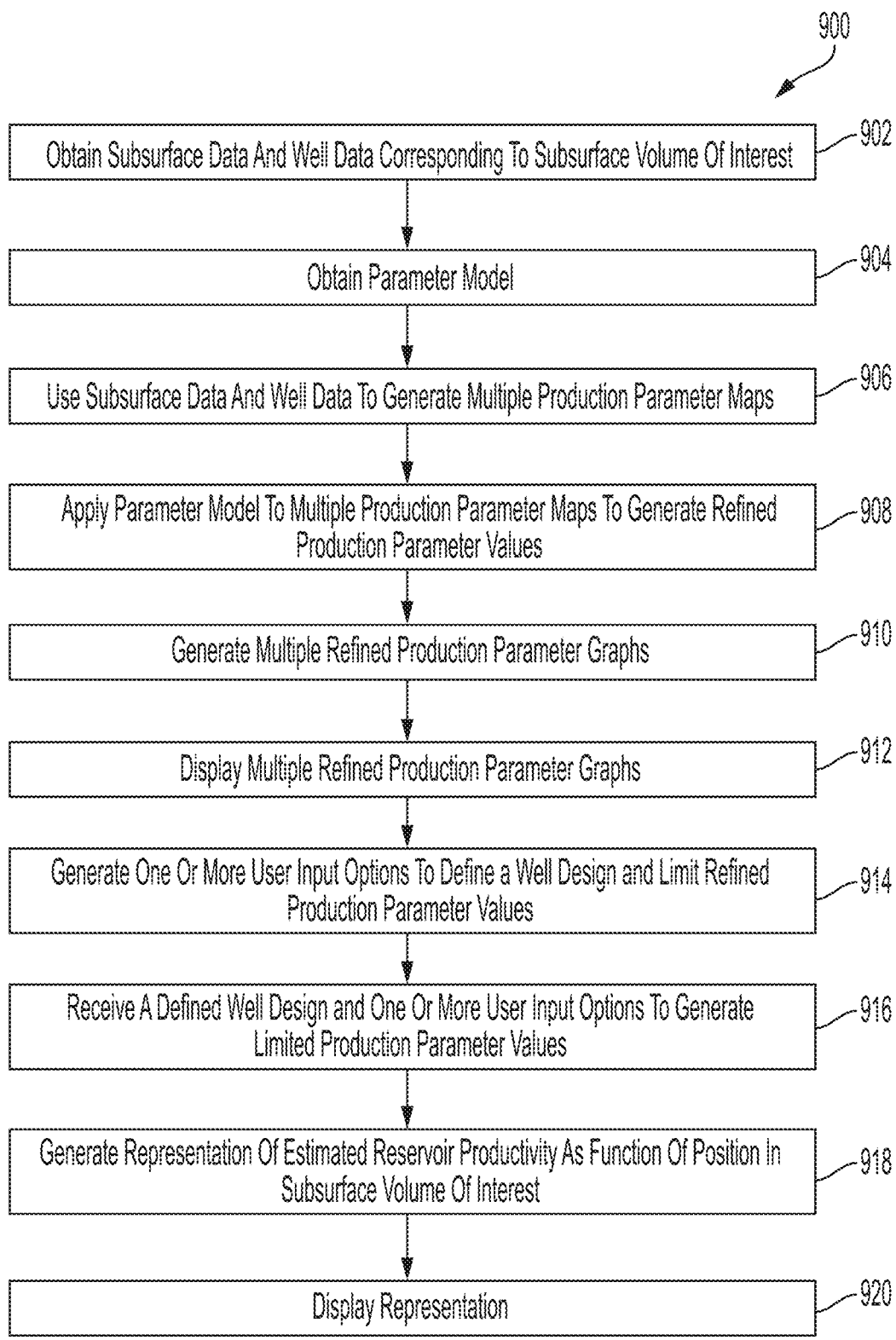
FIG. 9 includes a flow chart of a method for estimating reservoir productivity as a function of position in a subsurface volume of interest, in accordance with one or more implementations.
Figure 21:
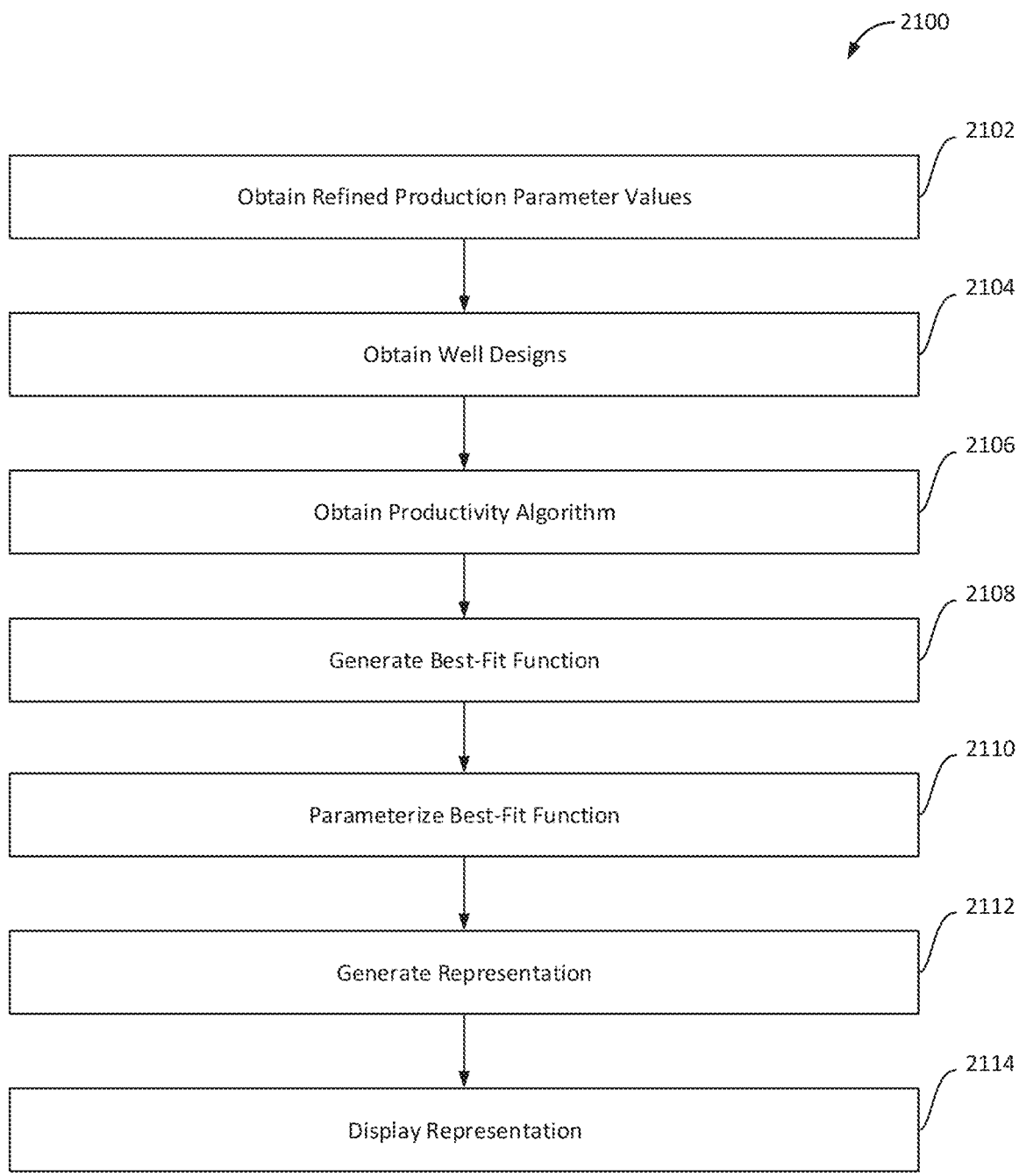
FIG. 21 includes a flow chart of a method for estimating a well design as a function of position in a subsurface volume of interest based on a reservoir productivity parameter, in accordance with one or more implementations.

FIG. 9 illustrates a method 900 for estimating reservoir productivity as a function of position in a subsurface volume of interest, in accordance with one or more implementations. The operations of methods 900 and 2100 presented below are intended to be illustrative. In some implementations, methods 900 and 2100 may be accomplished with one or more additional operations not described, and/or without one or more of the operations discussed. Additionally, the order in which the operations of methods 900 and 2100 are illustrated in FIGS. 9 and 21 and described below is not intended to be limiting.

In some implementations, methods 900 and 2100 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of methods 900 and 2100 in response to instructions stored electronically on an electronic storage medium. The one or more processing devices may include one or more devices configured through hardware, firmware, and/or software to be specifically designed for execution of one or more of the operations of methods 900 and 2100.

An operation 902 may include obtaining, from the non-transient electronic storage, subsurface data and well data corresponding to a subsurface volume of interest. The subsurface data and the well data may include production parameter values for multiple production parameters as a function of position in the subsurface volume of interest, thereby characterizing subsurface production features that affect the reservoir productivity. Operation 902 may be performed by one or more hardware processors configured by machine-readable instructions including a component that is the same as or similar to subsurface data and well data component 108, in accordance with one or more implementations.

An operation 904 may include obtaining, from the non-transient electronic storage, a parameter model. The parameter model may be trained using training data on an initial parameter model. The training data may include well data and the production parameter values for corresponding multiple production parameters affecting productivity of the one or more wells as a function of position in the subsurface volume of interest. The parameter model may include a random forest algorithm. Operation 904 may be performed by one or more hardware processors configured by machine-readable instructions including a component that is the same as or similar to parameter model component 110, in accordance with one or more implementations.

An operation 906 may include using, with the one or more physical computer processors, the subsurface data and the well data to generate multiple production parameter maps. A given production parameter map may represent the production parameter values for a given production parameter as a function of time and position in the subsurface volume of interest. Operation 906 may be performed by one or more hardware processors configured by machine-readable instructions including a component that is the same as or similar to subsurface data and well data component 108, in accordance with one or more implementations.

An operation 908 may include applying, with the one or more physical computer processors, the parameter model to the multiple production parameter maps to generate refined production parameter values. Operation 908 may be performed by one or more hardware processors configured by machine-readable instructions including a component that is the same as or similar to parameter model component 110, in accordance with one or more implementations.

An operation 910 may include generating, with the one or more physical computer processors, multiple refined production parameter graphs from the refined production parameter values. A given refined production parameter graph may specifythe refined production parameter values for a corresponding production parameter as a function of estimated reservoir productivity. Operation 910 may be performed by one or more hardware processors configured by machine-readable instructions including a component that is the same as or similar to production parameter graph component 112, in accordance with one or more implementations.

An operation 912 may include displaying, via the graphical user interface, the multiple refined production parameter graphs. Operation 912 may be performed by one or more hardware processors configured by machine-readable instructions including a component that is the same as or similar to production parameter graph component 112, in accordance with one or more implementations.

An operation 914 may include generating, with the one or more physical computer processors, one or more user input options to define a well design and limit the refined production parameter values corresponding to individual ones of the multiple refined production parameters. Operation 914 may be performed by one or more hardware processors configured by machine-readable instructions including a component that is the same as or similar to user input component 114, in accordance with one or more implementations.

An operation 916 may include receiving, via the graphical user interface, a defined well design the one or more user input options selected by a user to limit the refined production parameter values corresponding to the multiple refined production parameter graphs to generate limited production parameter values. Operation 916 may be performed by one or more hardware processors configured by machine-readable instructions including a component that is the same as or similar to user input component 114, in accordance with one or more implementations.

An operation 918 may include generating, with the one or more physical computer processors, a representation of estimated reservoir productivity as a function of position in the subsurface volume of interest using the defined well design and visual effects to depict at least a portion of the limited production parameter values, based on the one or more user input options selected. Operation 918 may be performed by one or more hardware processors configured by machine-readable instructions including a component that is the same as or similar to representation component 116, in accordance with one or more implementations.

An operation 920 may include displaying, via the graphical user interface, the representation. Operation 920 may be performed by one or more hardware processors configured by machine-readable instructions including a component that is the same as or similar to representation component 116, in accordance with one or more implementations.

Figure 10:
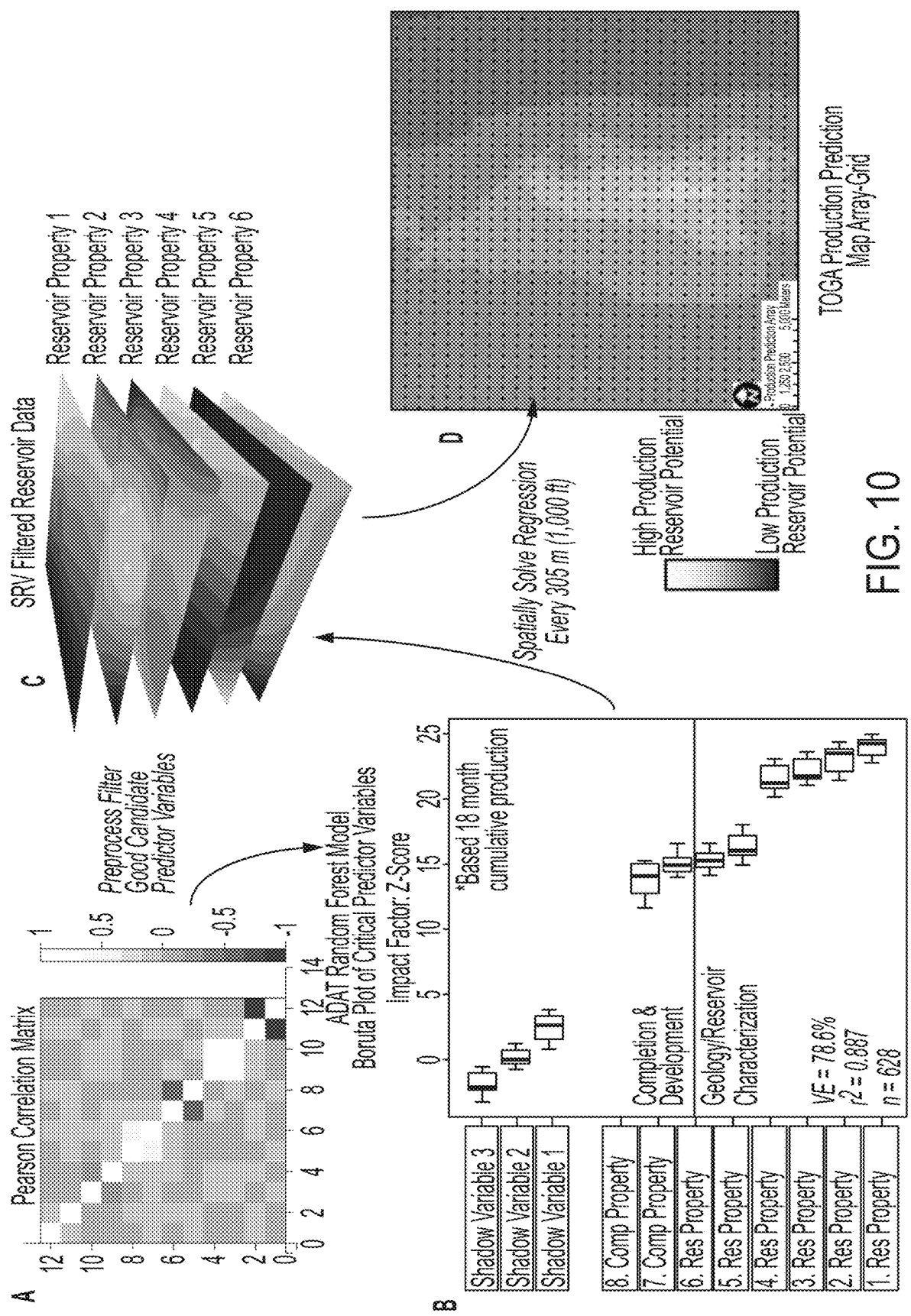
FIG. 10 illustrates a workflow for estimating productivity of a well location as a function of position in a subsurface volume of interest, in accordance with one or more implementations.
Figure 11:
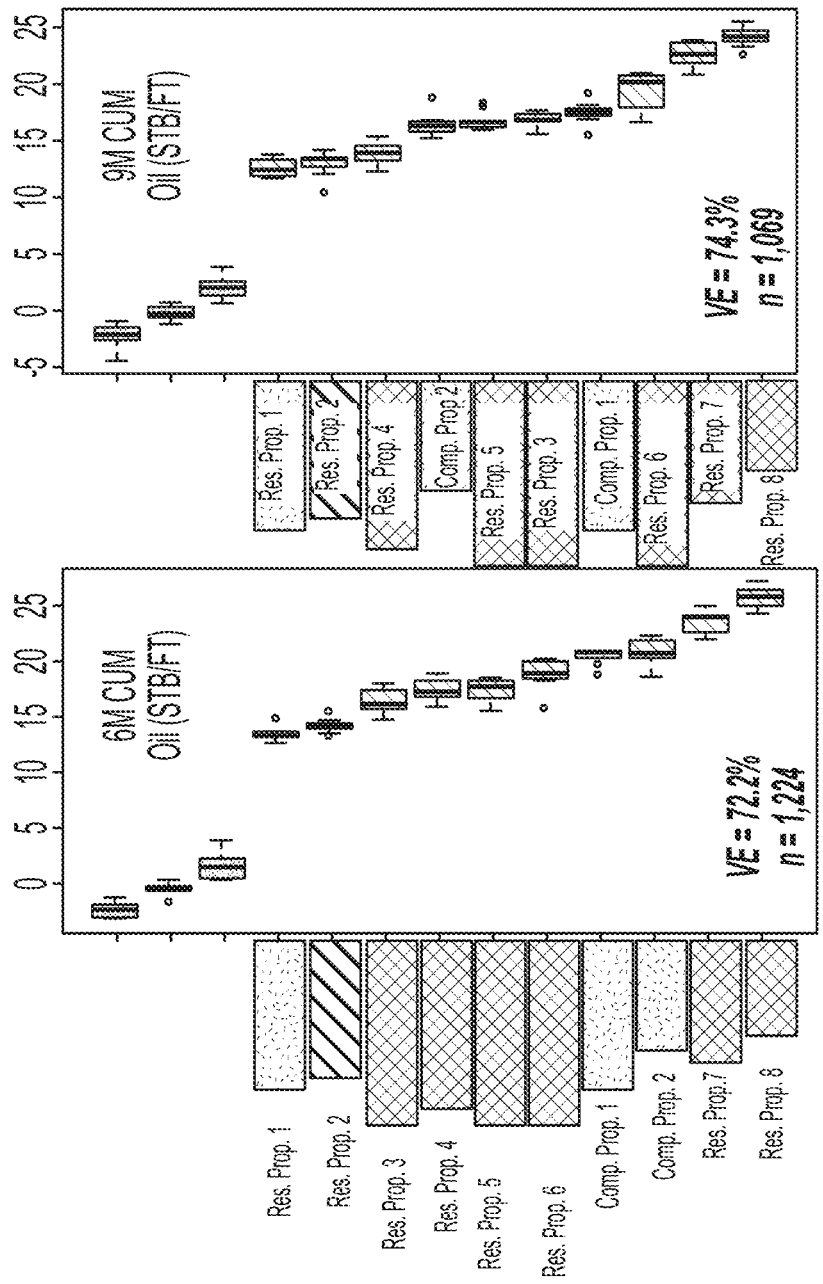
FIG. 11 illustrates example production parameter graphs, in accordance with one or more implementations.

FIG. 10 illustrates a workflow for estimating reservoir productivity as a function of position in a subsurface volume of interest, in accordance with one or more implementations.

In part A, production parameter values may be pre-filtered for statistical significance and collinearity using, for example, a Pearson correlation matrix. In part B, a Boruta plot may be generated from the random forest model. The critical production parameters for estimating well productivity may be identified and ranked in order of an effect on estimated reservoir productivity. At part C, there is a production parameter graph interpretation. Grids of the production parameters identified in the Boruta plots may be used to estimate productivity for a mapped array of reservoirs. In part D, the multiple refined production parameter graphs may be used to generate limited production parameter values that may be combined into a representation. The representation may represent an estimated reservoir productivity as a function of position in the subsurface volume of interest.

FIGS. 11A, 11B, 11C, and 11D illustrate example production parameter graphs, in accordance with one or more implementations. As illustrated, the effect production parameters may have over time changes. For example, stress changes from having the greatest effect on estimated reservoir productivity to having the second greatest effect on estimated reservoir productivity to having the third greatest effect on estimated reservoir productivity. As one example, brittleness goes from having the ninth greatest effect on estimated reservoir productivity to having the second greatest effect on estimated reservoir productivity over time.

Figure 12:
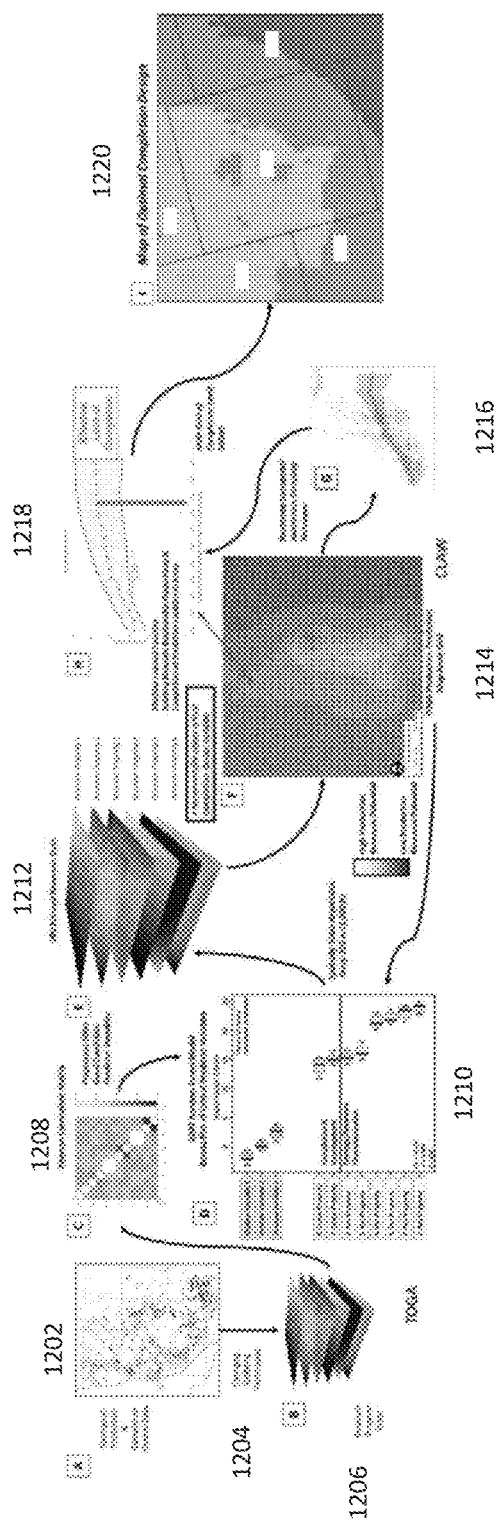
FIG. 12 illustrates a flowchart of a method for estimating a well design as a function of position in a subsurface volume of interest based on a reservoir productivity parameter, in accordance with some implementations.

FIG. 12 illustrates a flowchart of a method for estimating a well design as a function of position in a subsurface volume of interest based on a reservoir productivity parameter, in accordance with some implementations. 1202, 1204, and 1206 may be similar to steps 152, 154, and 156, respectively, described above in FIG. 1B. 1208, 1210, 1212, and 1214 may be similar to part A, part B, part C, and part D, respectively, of FIG. 10.

1216 may illustrate sampling the well data that is representative of the subsurface volume of interest. This Geospatial Bootstrap Method of sampling may be used to apply error bars to the data to generate uncertainty corresponding to reservoir productivity. The Geospatial Bootstrap Method used is an adaption of that developed by Julian Thorne and Lewis Li. This method ensures a representative subsample of testing data is used to evaluate uncertainty in the partial dependency plots. This bootstrap approach selects random points across the broad geographic space, but restricts clustered, repetitive oversampling in localized areas.

1218 may illustrate a best-fit function applied to the input and output of the productivity algorithm that uses the multiple well designs to generate an estimated reservoir productivity. 1218 may be parameterized by the reservoir productivity parameter, as described above.

1220 may illustrate a representation of the refined well designs parameterized by the reservoir productivity parameter. The refined well designs may be a refined well design based on the reservoir productivity parameter selected and/or used.

Figure 13:
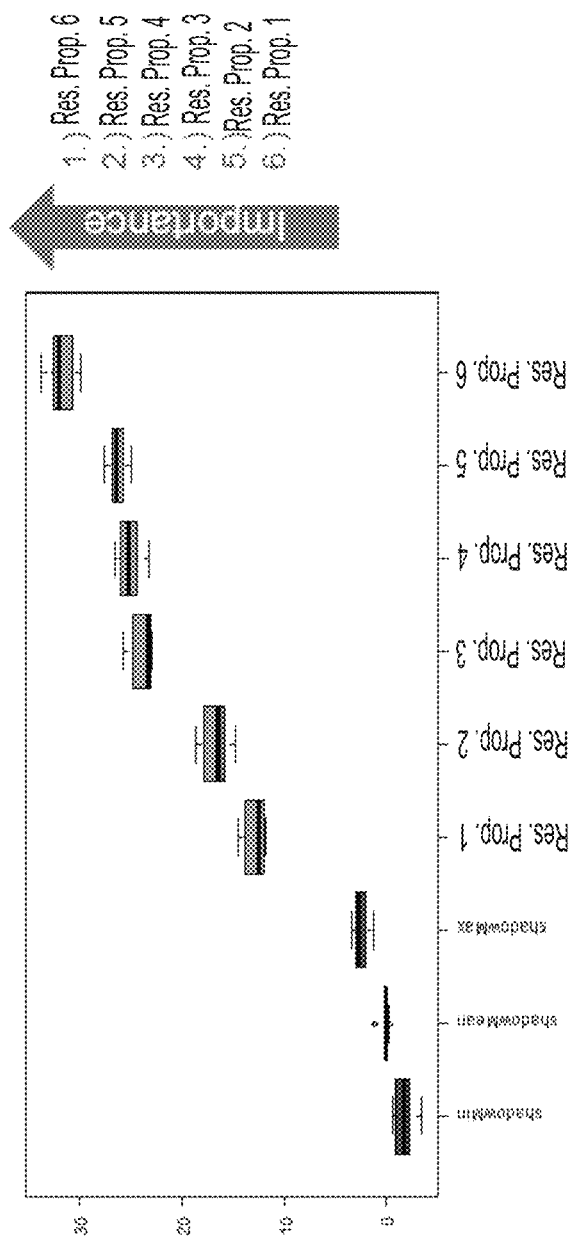
FIG. 13 illustrates example Boruta plots identifying an effect design parameter values may have on reservoir productivity, in accordance with one or more implementations.

FIG. 13 illustrates example Boruta plots identifying an effect design parameter values may have on reservoir productivity, in accordance with one or more implementations. Data points higher up on the y-axis may illustrate more importance to productivity. For example, fracture fluid intensity, true vertical depth (TVD), total water saturation (SWT), silica facies net-to-gross (NTG), proppant intensity, and total porosity (PHIT) may have a greater effect on productivity than shadowMax, shadowMean, and shadowMin.

Figure 14:
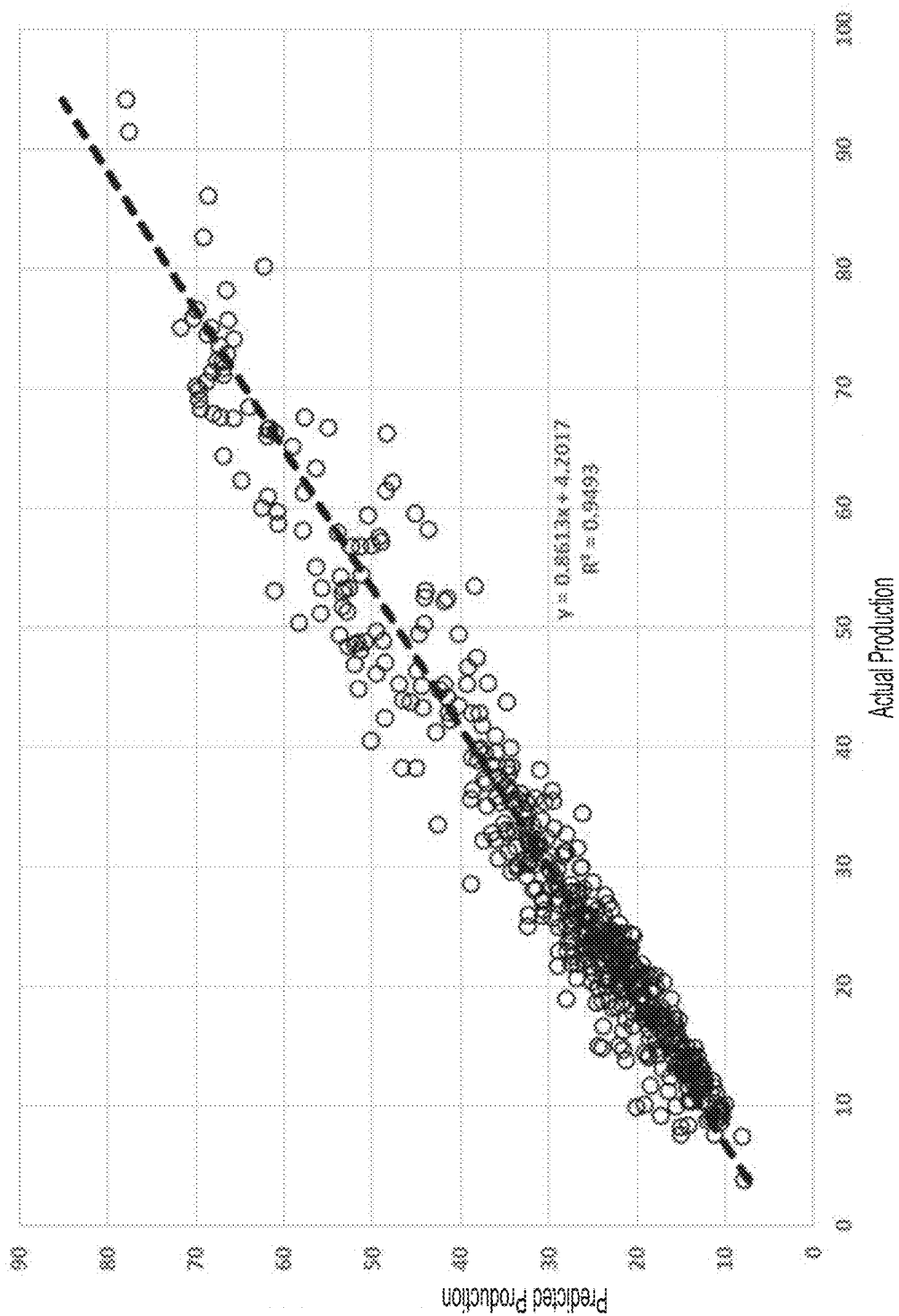
FIG. 14 illustrates an example distribution of actual productivity versus predicted productivity.

FIG. 14 illustrates an example distribution of actual productivity versus predicted productivity. Estimated productivity may be plotted on the y-axis and actual productivity may be plotted on the x-axis, which validates the presently disclosed technology.

Figure 15:
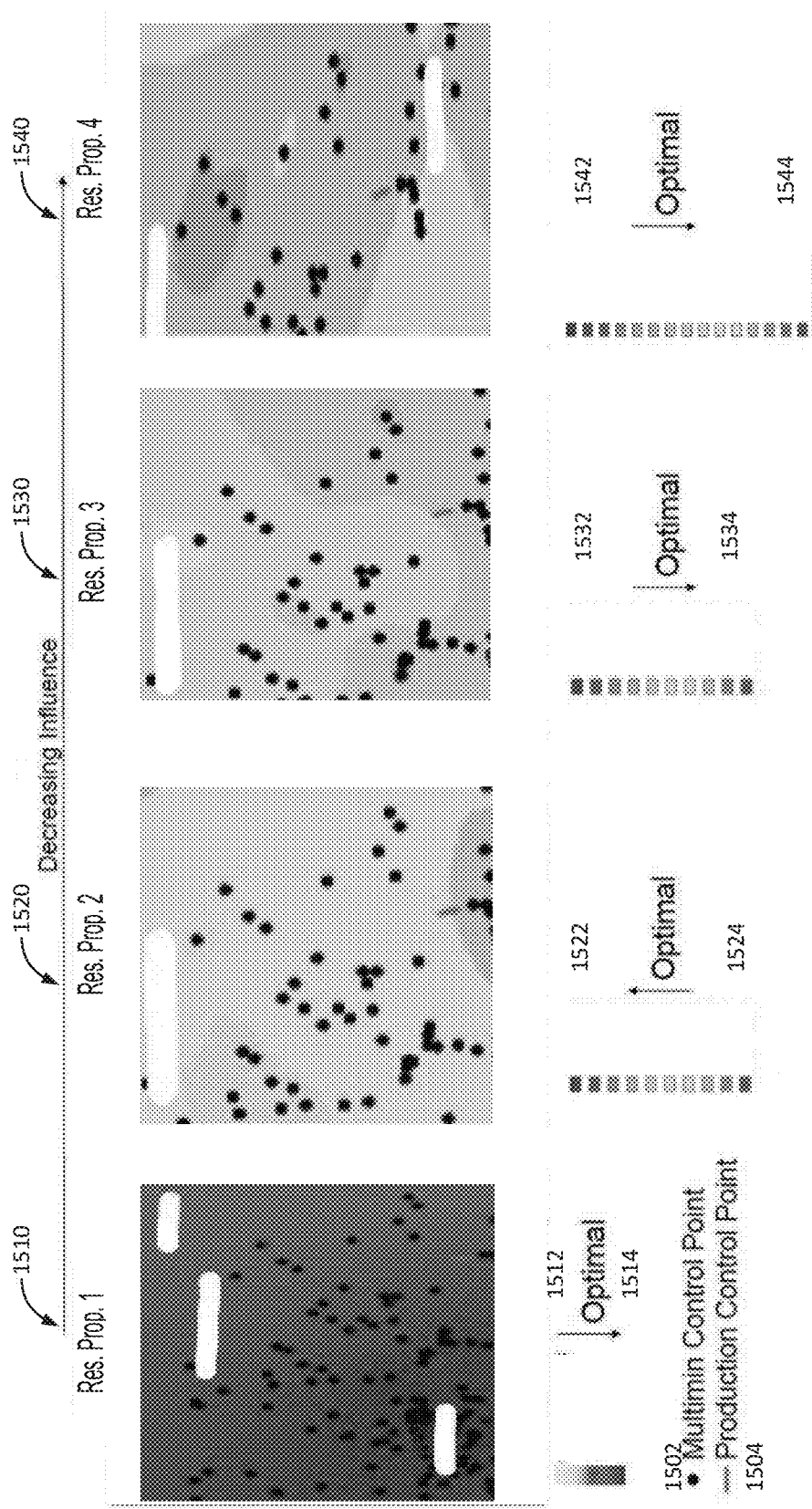
FIG. 15 illustrates an example graph of the effect of a design parameter value on productivity, in accordance with one or more implementations.

FIG. 15 illustrates an example graph of the effect of a design parameter value on productivity, in accordance with one or more implementations. Black dots 1502 and lines 1504 illustrate multimin control points and production control points, respectively. 1510 may have a greater effect on productivity than 1520, 1520 may have a greater effect on productivity than 1530, and 1530 may have a greater effect on productivity than 1540.

1510 illustrates changes in mean TVD as a function of position in the subsurface volume of interest. 1512 illustrates more shallow areas while 1514 illustrates deeper areas. The mean TVD may be optimized in deeper locations.

1520 illustrates changes in SWT as a function of position in the subsurface volume of interest. 1522 illustrates areas with less SWT while 1524 illustrates areas with more SWT. The SWT may be optimized in locations with less SWT.

1530 illustrates changes in Silica NTG as a function of position in the subsurface volume of interest. 1532 illustrates areas with more silica NTG while 1534 illustrates areas with less silica NTG. The silica NTG may be optimized in locations with more silica NTG.

1540 illustrates changes in PHIT as a function of position in the subsurface volume of interest. 1542 illustrates areas with more PHIT while 1544 illustrates areas with less PHIT. The PHIT may be optimized in location with more PHIT.

Figure 16:
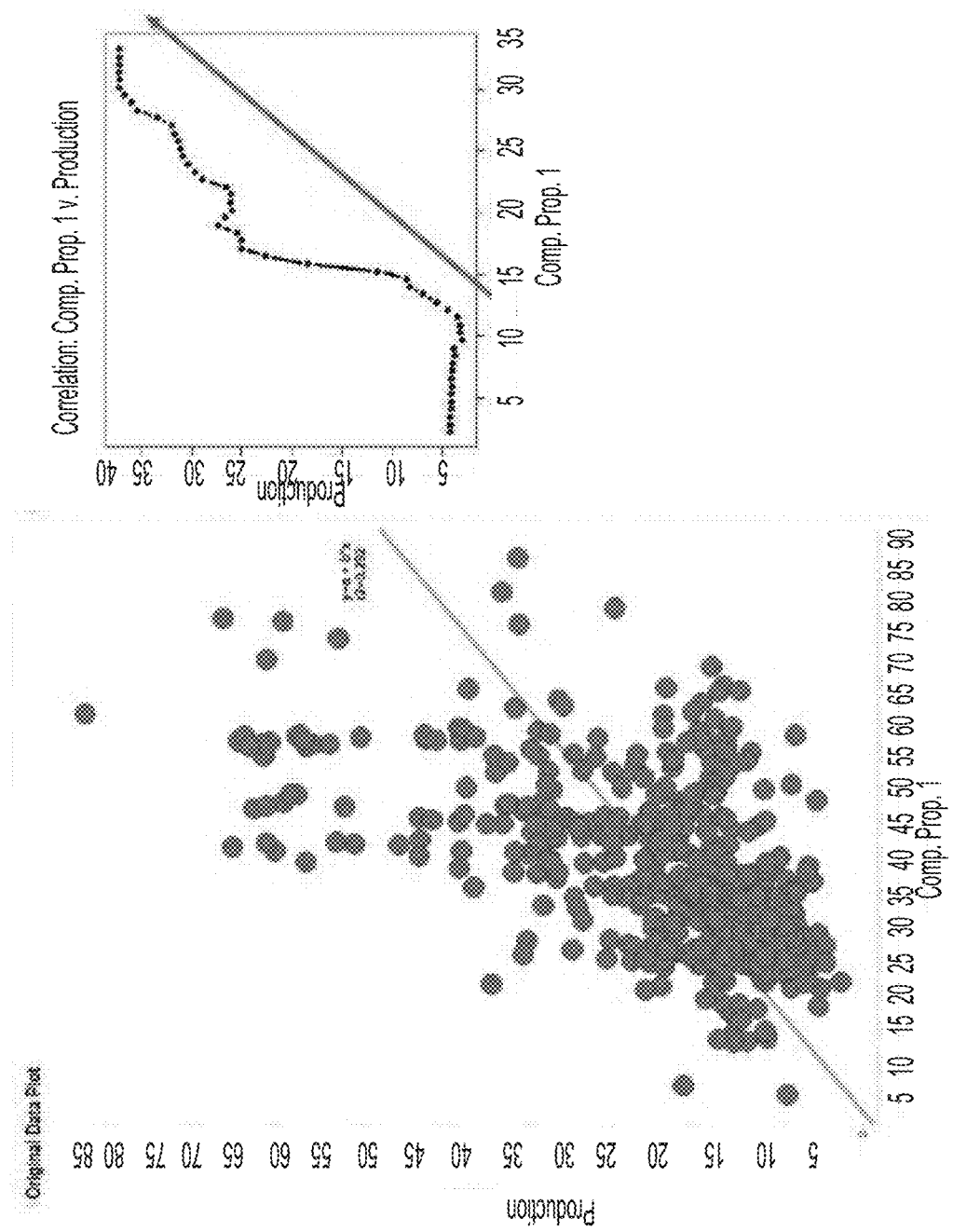
FIG. 16 illustrates an example design parameter graph, in accordance with one or more implementations.

FIG. 16 illustrates an example design parameter graph, in accordance with one or more implementations. As illustrated, fracture fluid intensity may increase productivity with more fracture fluid.

Figure 17:
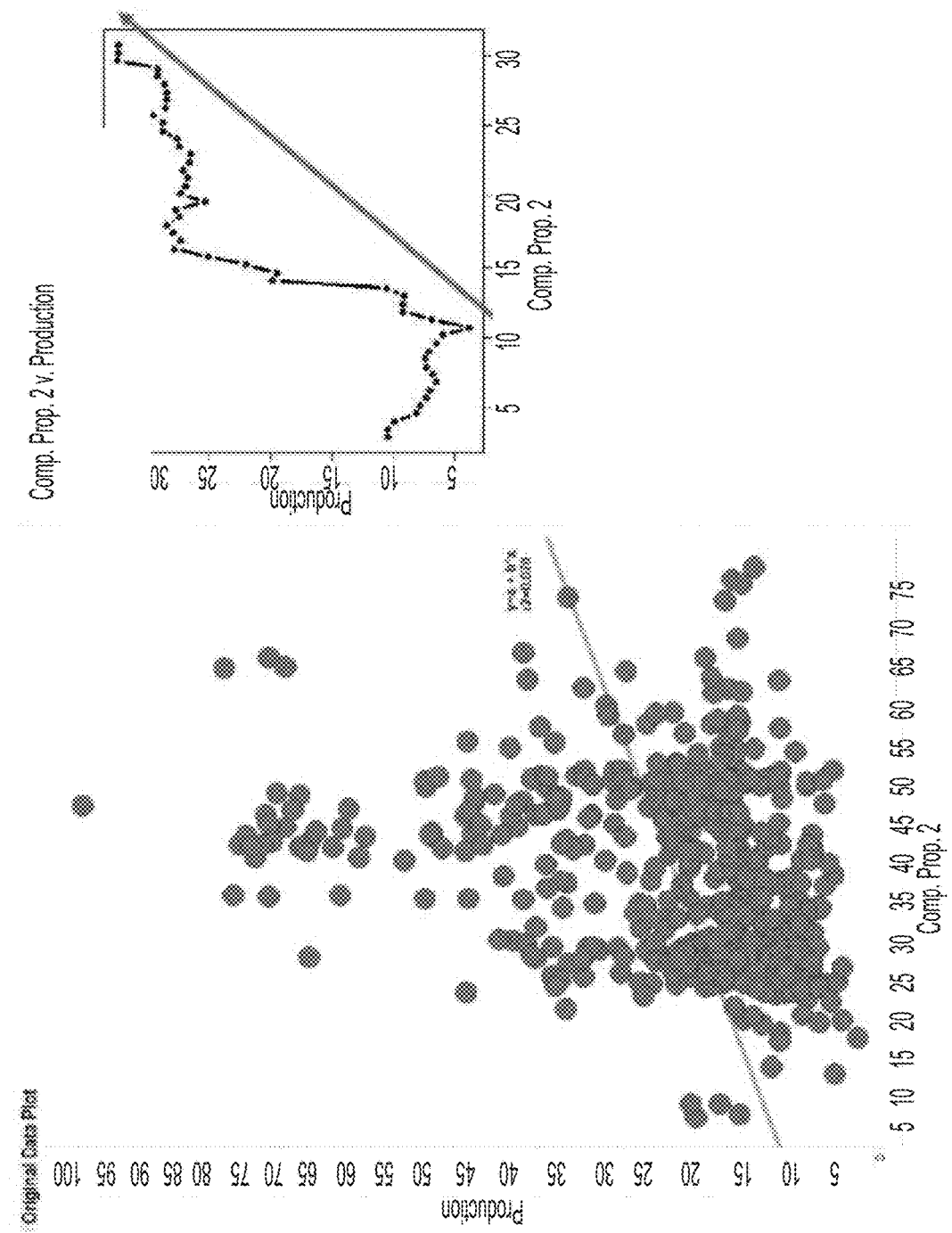
FIG. 17 illustrates an example design parameter graph, in accordance with one or more implementations.

FIG. 17 illustrates an example design parameter graph, in accordance with one or more implementations. As illustrated, proppant intensity may increase productivity with more proppant intensity.

Figure 18:
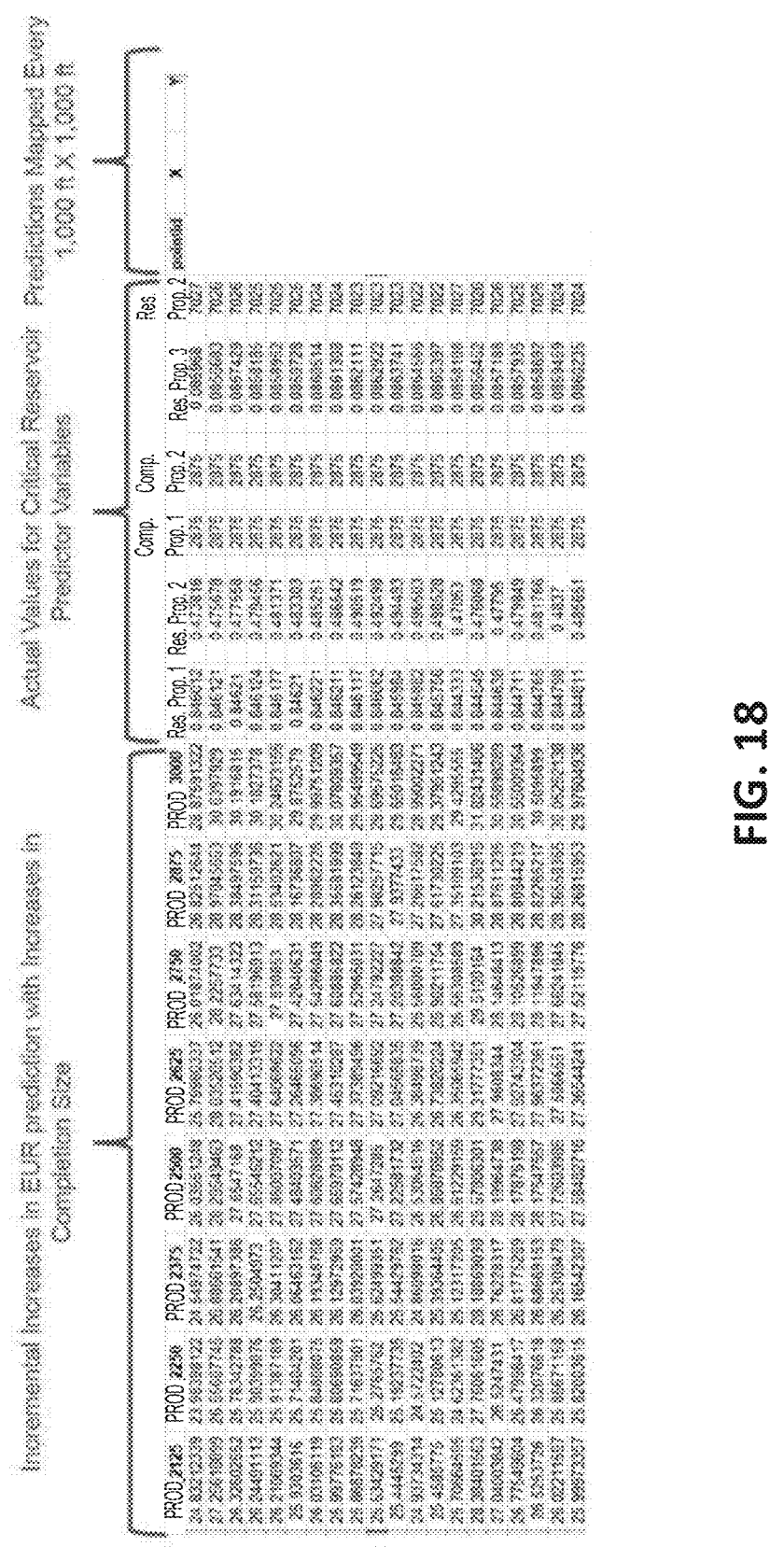

FIG. 18 is an example output of the disclosed technology, in accordance with one or more implementations. As illustrated, the presently disclosed technology may include information on the effect of the productivity based on changes to the completion size, information relating to one or more design parameters, and corresponding positions in the subsurface volume of interest.

Figure 19:
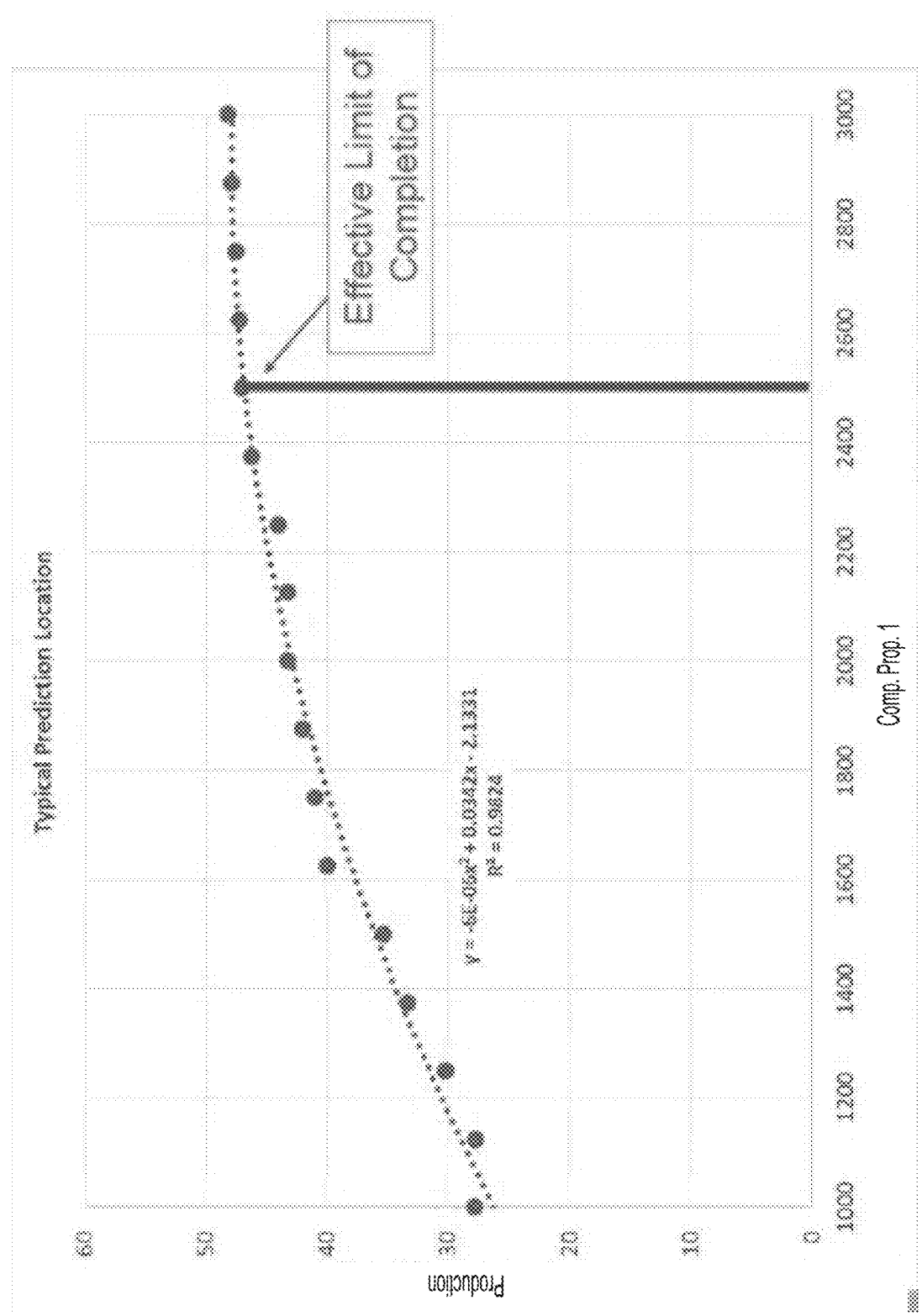
FIG. 19 illustrates an example best-fit function, in accordance with one or more implementations.

FIG. 19 illustrates an example best-fit function, in accordance with one or more implementations. In implementations, the well design may be converted to time, and the productivity, on the y-axis, may be converted to a rate. A derivative may be equivalent to the sill value. This may be performed at every position in the subsurface volume of interest. The derivative may be based on the reservoir productivity parameter.

Figure 20:
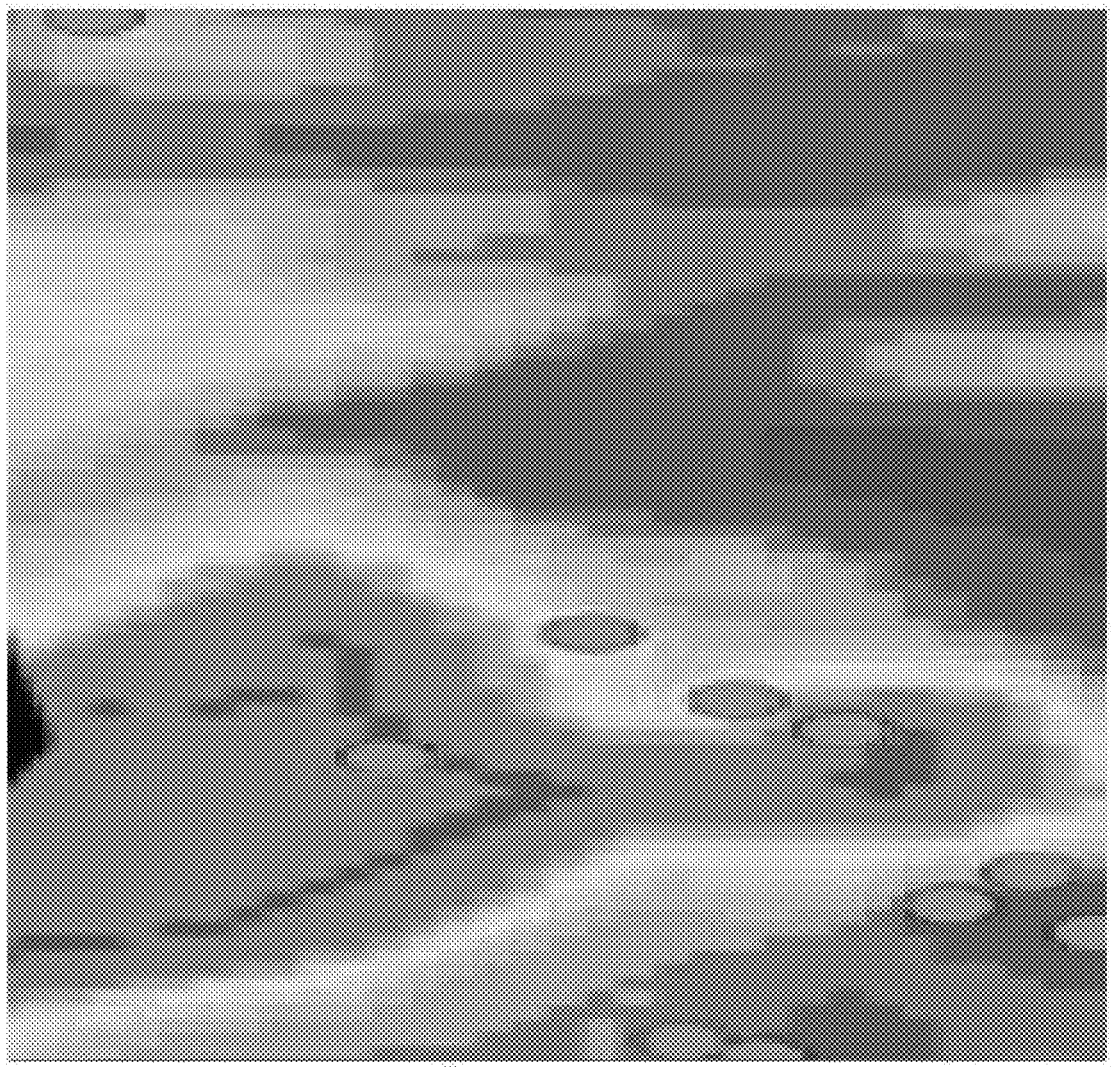
FIG. 20 illustrates an example representation, in accordance with one or more implementations.
Figure 20:
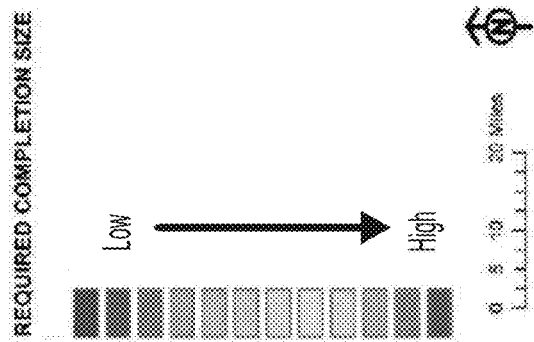

FIG. 20 illustrates an example representation, in accordance with one or more implementations. As illustrated, the representation may illustrate well designs as a function of position in the subsurface volume of interest. The representation may illustrate the minimum well design for near maximum recovery from a location in the subsurface volume of interest. In implementations, an assumption may be that there is a 1:1 proppant/frac fluid ratio.

FIG. 21 includes a flow chart of a method for estimating a well design as a function of position in a subsurface volume of interest based on a reservoir productivity parameter, in accordance with one or more implementations. Operation 2102 may be similar to the operations of FIG. 9. Operation 2102 may include obtaining refined production parameter values. The refined production parameter values may have been generated by obtaining subsurface data and well data corresponding to a subsurface volume of interest. The subsurface data and the well data may include production parameter values for multiple production parameters as a function of position in the subsurface volume of interest, thereby characterizing subsurface production features that affect the reservoir productivity.

In implementations, a parameter model may be applied to the subsurface data and the well data. The parameter model may be trained using training data on an initial parameter model. The training data may include well data and the production parameter values for corresponding multiple production parameters affecting productivity of the one or more wells as a function of position in the subsurface volume of interest. The parameter model may include a random forest algorithm.

In some implementations, applying the parameter model may generate refined production parameter values. In implementations, generating refined production parameter values may include using the subsurface data and the well data to generate multiple production parameter maps. A given production parameter map may represent the production parameter values for a given production parameter as a function of time and position in the subsurface volume of interest. In implementations, generating refined production parameter values may include applying the parameter model to the multiple production parameter maps to generate refined production parameter values.

In implementations, the multiple refined production parameter graphs may be displayed. In implementations, one or more user input options to define a well design and limit the refined production parameter values corresponding to individual ones of the multiple refined production parameters may be generated. In implementations, a defined well design selected by a user to limit the refined production parameter values corresponding to the multiple refined production parameter graphs may be received to generate limited production parameter values. In implementations, a representation of estimated reservoir productivity as a function of position in the subsurface volume of interest may be generated. The representation may be generated using the defined well design and visual effects to depict at least a portion of the limited production parameter values, based on the one or more user input options selected. In implementations, the representation may be displayed. Operation 2102 may be performed by one or more hardware processors configured by machine-readable instructions including a component that is the same as or similar to subsurface data and well data component 108, parameter model component 110, production parameter graph component 112, user input component 114, and representation component 116, in accordance with one or more implementations.

Operation 2104 may include obtaining multiple well designs. An individual well design may specify multiple design parameter values for one or more design parameters as a function of position in the subsurface volume of interest.

Operation 2106 may include obtaining a productivity algorithm. As described above, the productivity algorithm may be generated by obtaining an initial productivity algorithm and conditioning the initial productivity algorithm using well design training data. The well design training data may include the refined production parameter values in the subsurface volume of interest, multiple sets of well designs in the subsurface volume of interest, and/or corresponding reservoir productivity values.

Operation 2108 may include generating a best-fit function. The best-fit function may be generated by applying the productivity algorithm to the multiple well designs. Applying the productivity algorithm to the multiple well designs may generate a distribution of well designs and estimated productivity values. The best-fit function may be a best-fit curve through the distribution.

Operation 2110 may include parameterizing the best-fit function based on the reservoir productivity parameter. Parameterizing may include deriving the best-fit function based on the reservoir productivity parameter. The derived best-fit function may include refined well designs. A given refined well design may specify a refined design parameter value for individual ones of the one or more design parameters as a function of position in the subsurface volume of interest.

Operation 2112 may include generating a representation. The representation may be of an estimated well design as a function of position in the subsurface volume of interest using visual effects to depict at least a portion of the refined design parameter values.

Operation 2114 may include displaying the representation.

Figure 22:
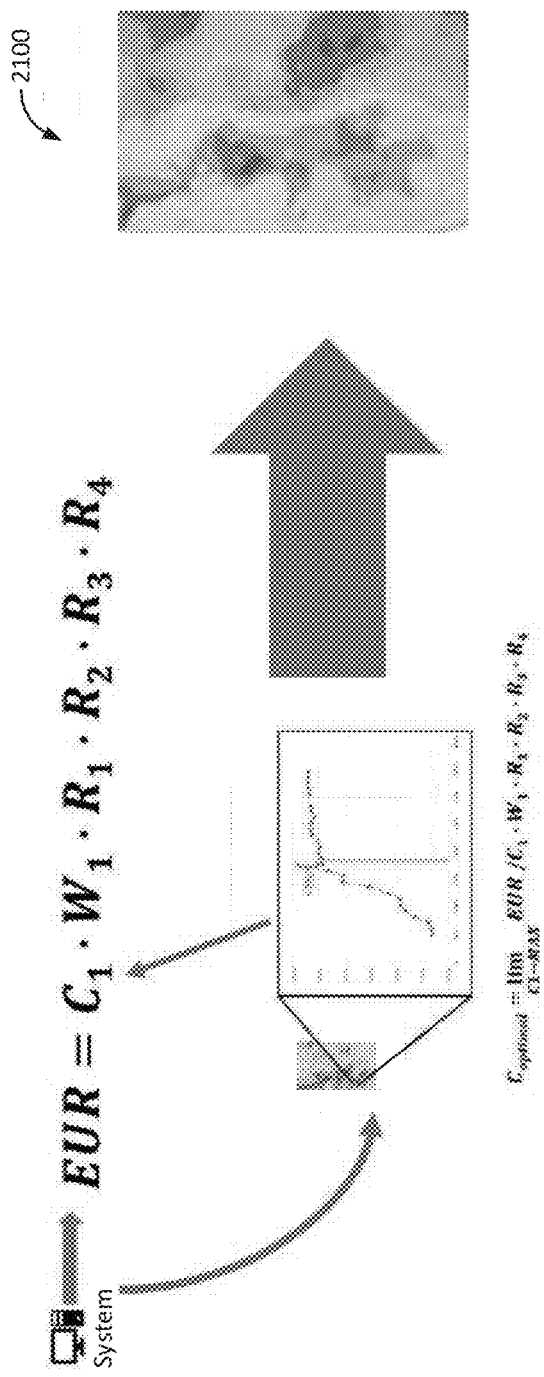
FIG. 22 illustrates a workflow to generate refined reservoir productivity values, in accordance with one or more implementations.

FIG. 22 illustrates a workflow to generate refined reservoir productivity values, in accordance with one or more implementations. As illustrated, C may represent completion designs, W may represent well spacing, and R may represent production parameters. The completion designs may be generated by one or more processes described herein. Using refined completion designs (e.g., completion designs that correspond to the one or more reservoir productivity parameters), refined well spacing (e.g., well spacing that corresponds to the reservoir productivity parameter), and/or refined production parameters, the refined reservoir productivity values may be generated.

Figure 23:
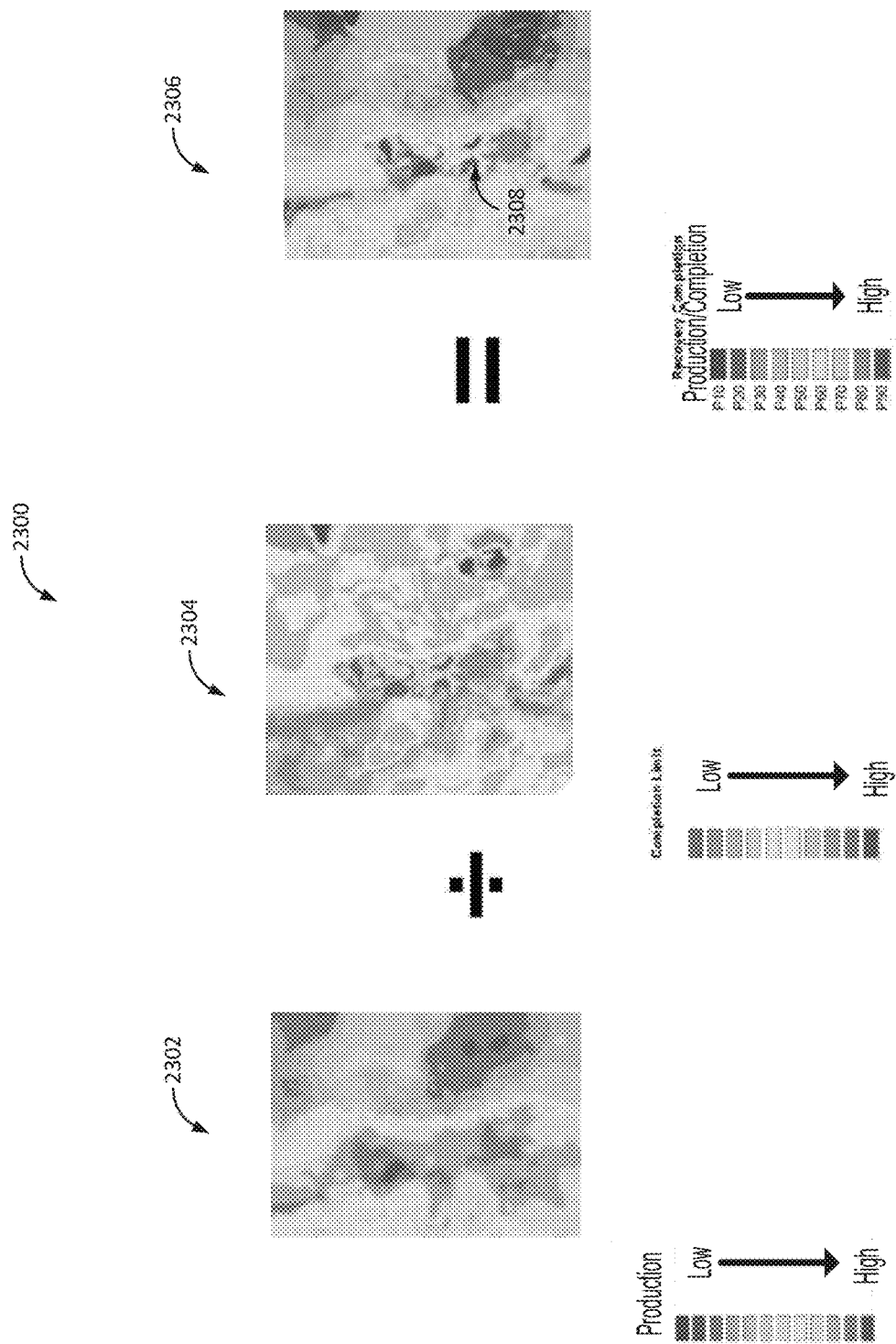
FIG. 23 illustrates a workflow to generate completion efficiency values, in accordance with one or more implementations.

FIG. 23 illustrates a workflow to generate completion efficiency values, in accordance with one or more implementations. 2302 illustrates an example representation of refined reservoir productivity values as a function of position in the subsurface volume of interest. 2304 illustrates an example representation of refined well designs as a function of position in the subsurface volume of interest. 2304 may be divided by 2302 to generate completion efficiency values. 2306 illustrates an example representation of completion efficiency values as a function of position in the subsurface volume of interest. 2308 illustrates one of the most productive regions in the subsurface volume of interest (i.e., the most recoverable hydrocarbons based on the refined well design).

Figure 24:
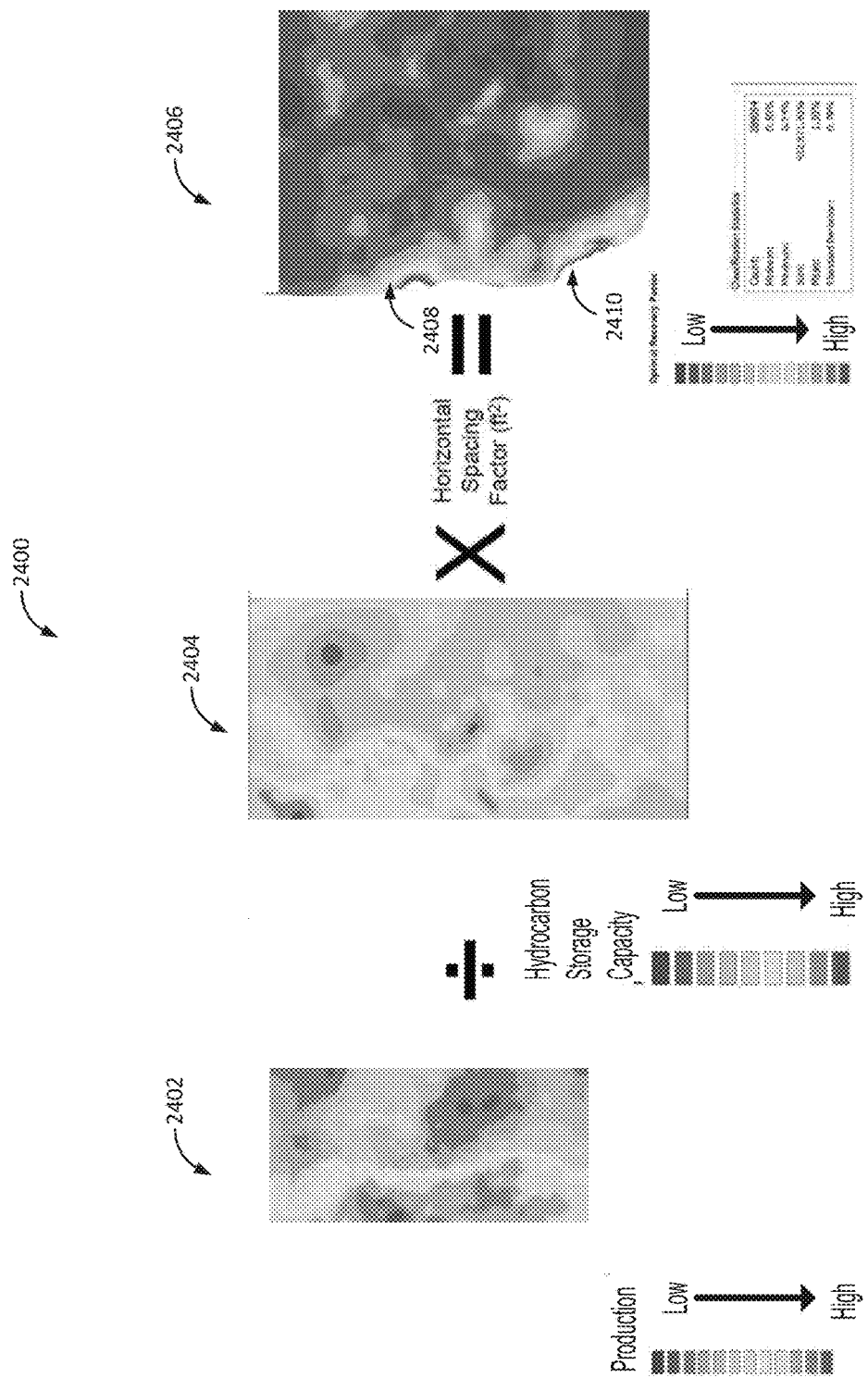
FIG. 24 illustrates a workflow to generate recovery factor values, in accordance with one or more implementations.

FIG. 24 illustrates a workflow 2400 to generate recovery factor values, in accordance with one or more implementations. 2402 illustrates an example representation of refined reservoir productivity values as a function of position in the subsurface volume of interest. 2404 illustrates an example representation of saturated oil porosity height. 2404 may be multiplied by a horizontal spacing factor to generate a volume of oil porosity as a function of position in the subsurface volume of interest. The resulting volume of oil may be divided by 2402 to generate recovery factor values. 2406 illustrates an example representation of recovery factor values as a function of position in the subsurface volume of interest. Region 2408 and region 2410 illustrate regions with the highest recovery factors in the subsurface volume of interest (i.e., the most recoverable hydrocarbons based on the total amount of hydrocarbons as a function of position).

Figure 25:
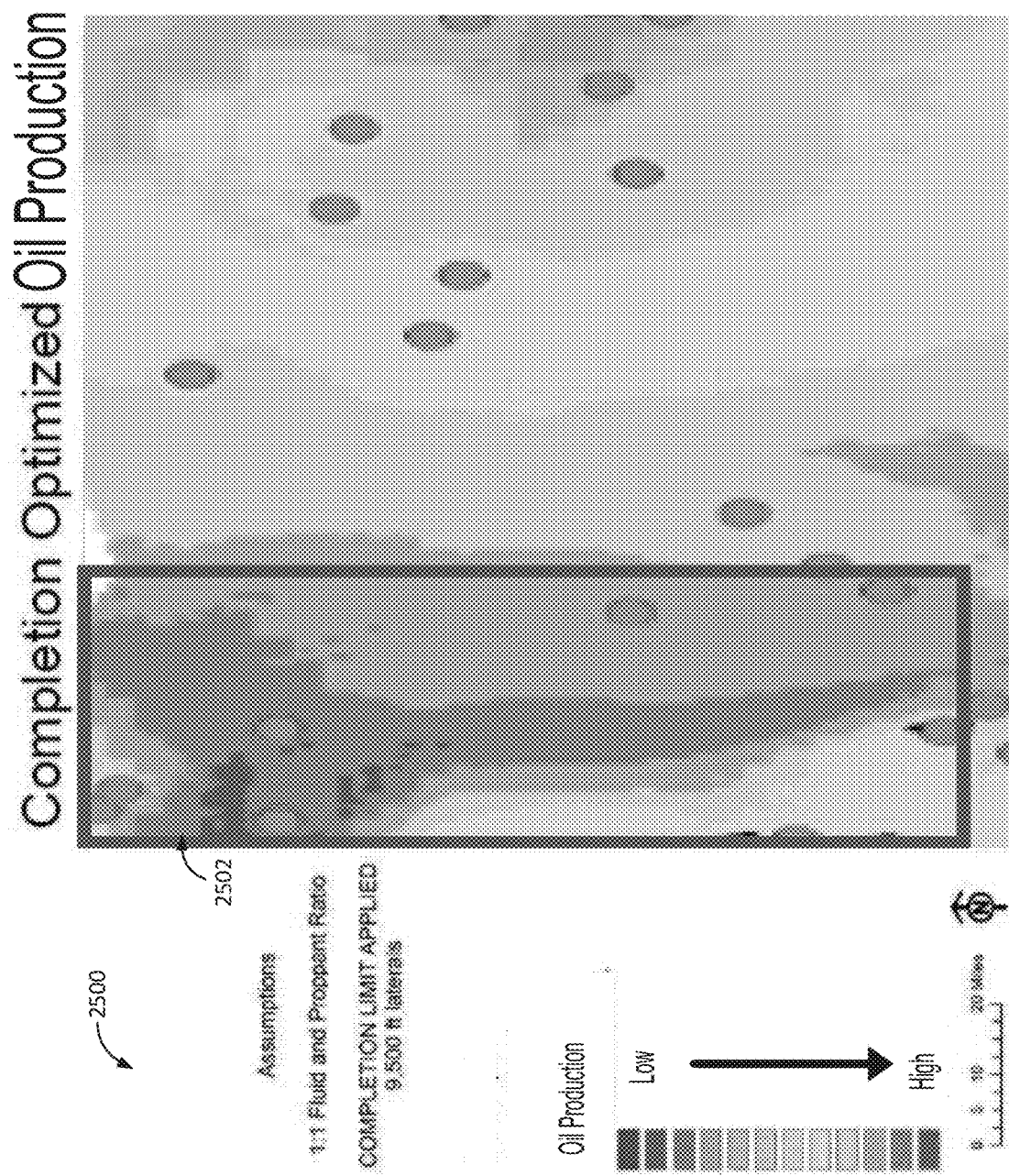
FIG. 25 illustrates an example representation of refined reservoir productivity values, in accordance with one or more implementations.

FIG. 25 illustrates an example representation 2500 of refined reservoir productivity values, in accordance with one or more implementations. Temperature map 2500 may correspond to predicted oil recovery that optimizes a diminishing point of returns. It should be appreciated that the predicted oil recovery could optimize one or more of the following: a completion limit, a cost-value threshold value, a maximum recovery threshold value, and other limits. The southeast portion is less productive than region 2502 in the subsurface volume of interest. This example representation may help identify more productive regions in the subsurface volume of interest based on the corresponding parameter. For example, in order to optimize productivity without accounting for completion efficiency or recovery factors, region 2502 is the most productive.

Figure 26:
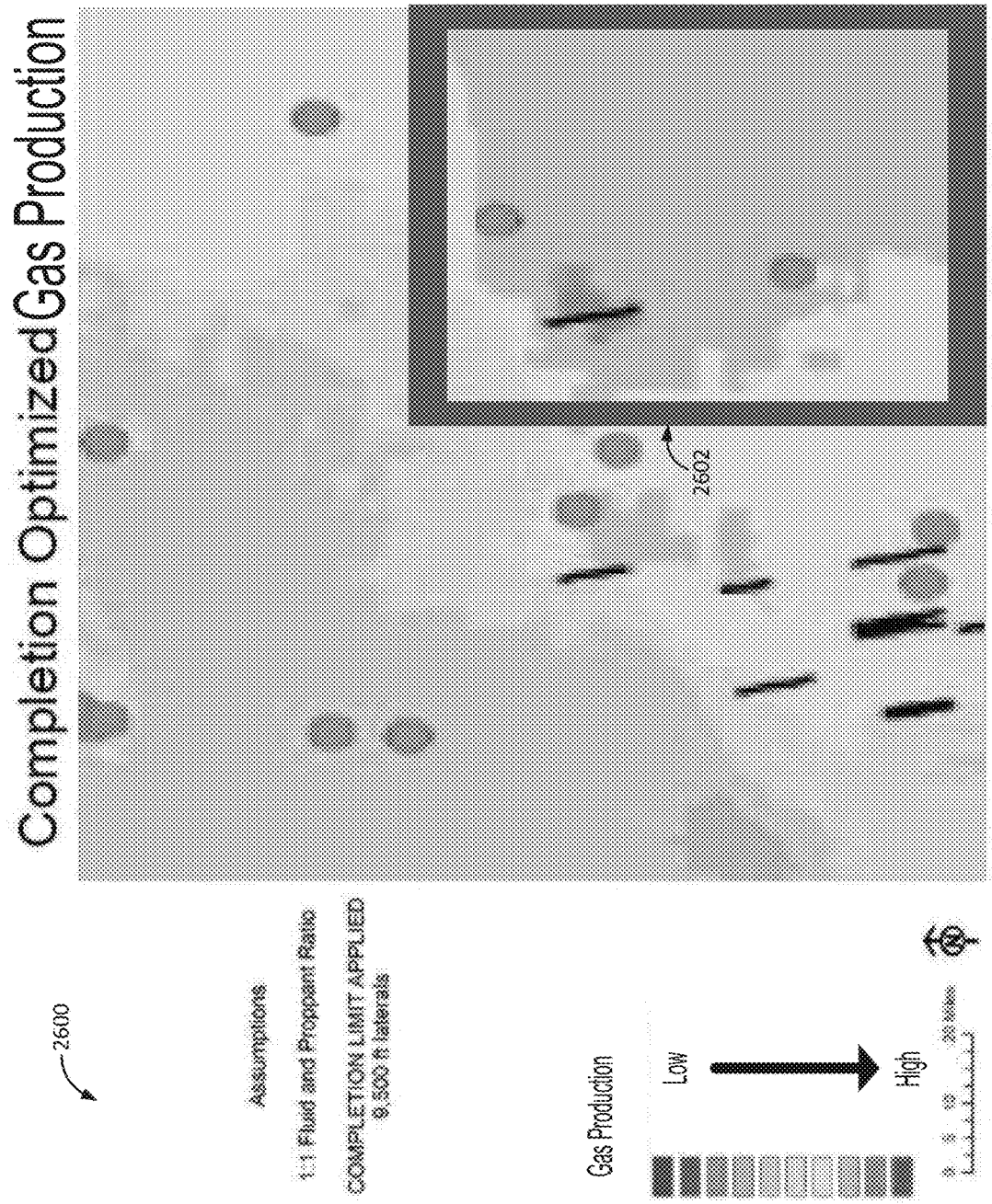
FIG. 26 illustrates an example representation of refined reservoir productivity values, in accordance with one or more implementations.

FIG. 26 illustrates an example representation 2600 of refined reservoir productivity values, in accordance with one or more implementations. FIG. 26 is substantially similar to FIG. 25 except it is directed to gas recovery. Additionally, region 2602 is the most productive regions with respect to gas.

Figure 27:
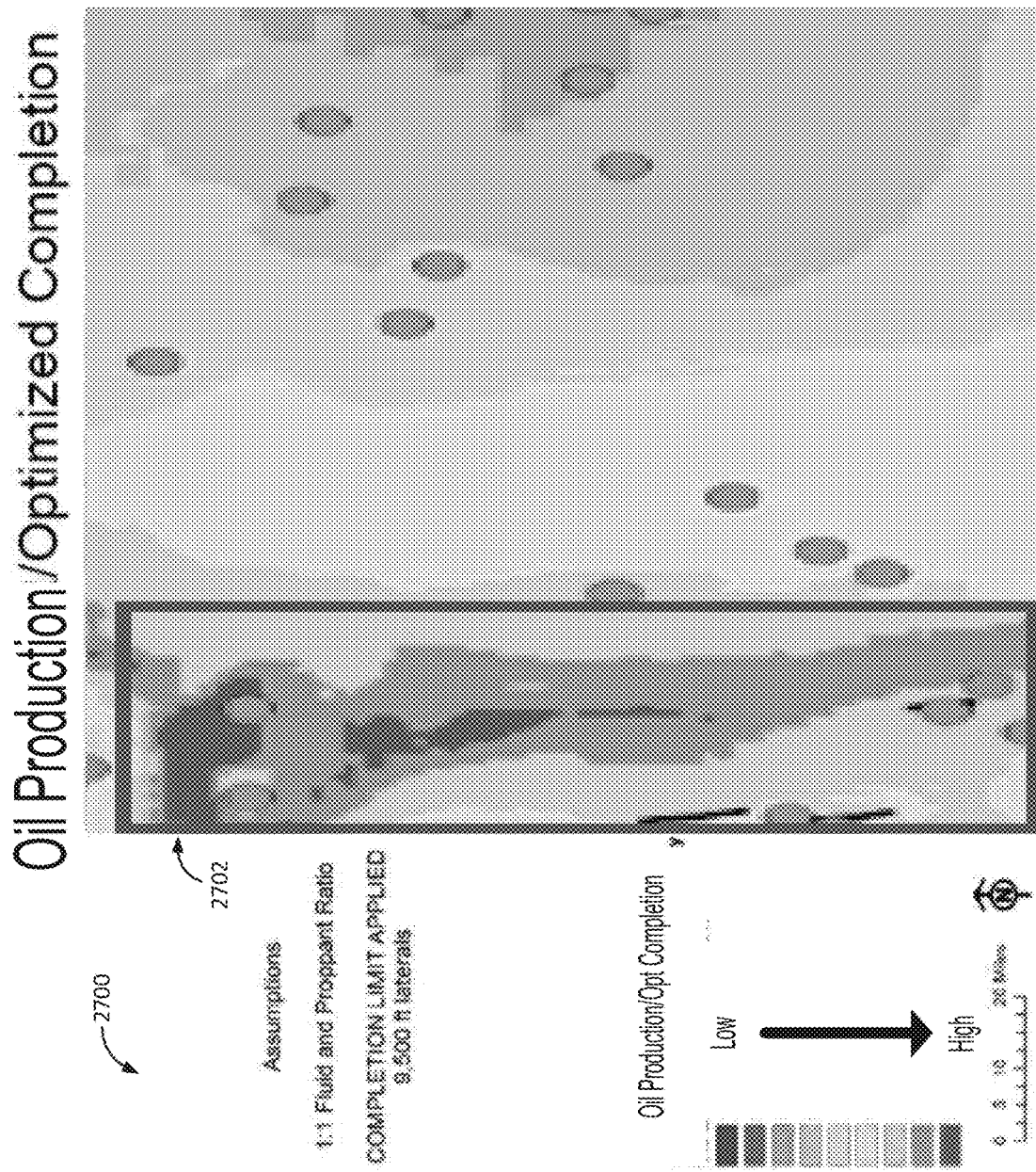
FIG. 27 illustrates an example representation of completion efficiency values, in accordance with one or more implementations.

FIG. 27 illustrates an example representation 2700 of completion efficiency values, in accordance with one or more implementations. Temperature map 2700 may correspond to how much value any given position in the subsurface volume of interest provides (i.e., how much oil can be recovered compared to the costs of a well design). This example representation may help identify more valuable regions in the subsurface volume of interest. For example, in order to optimize value, region 2702 is the most valuable.

Figure 28:
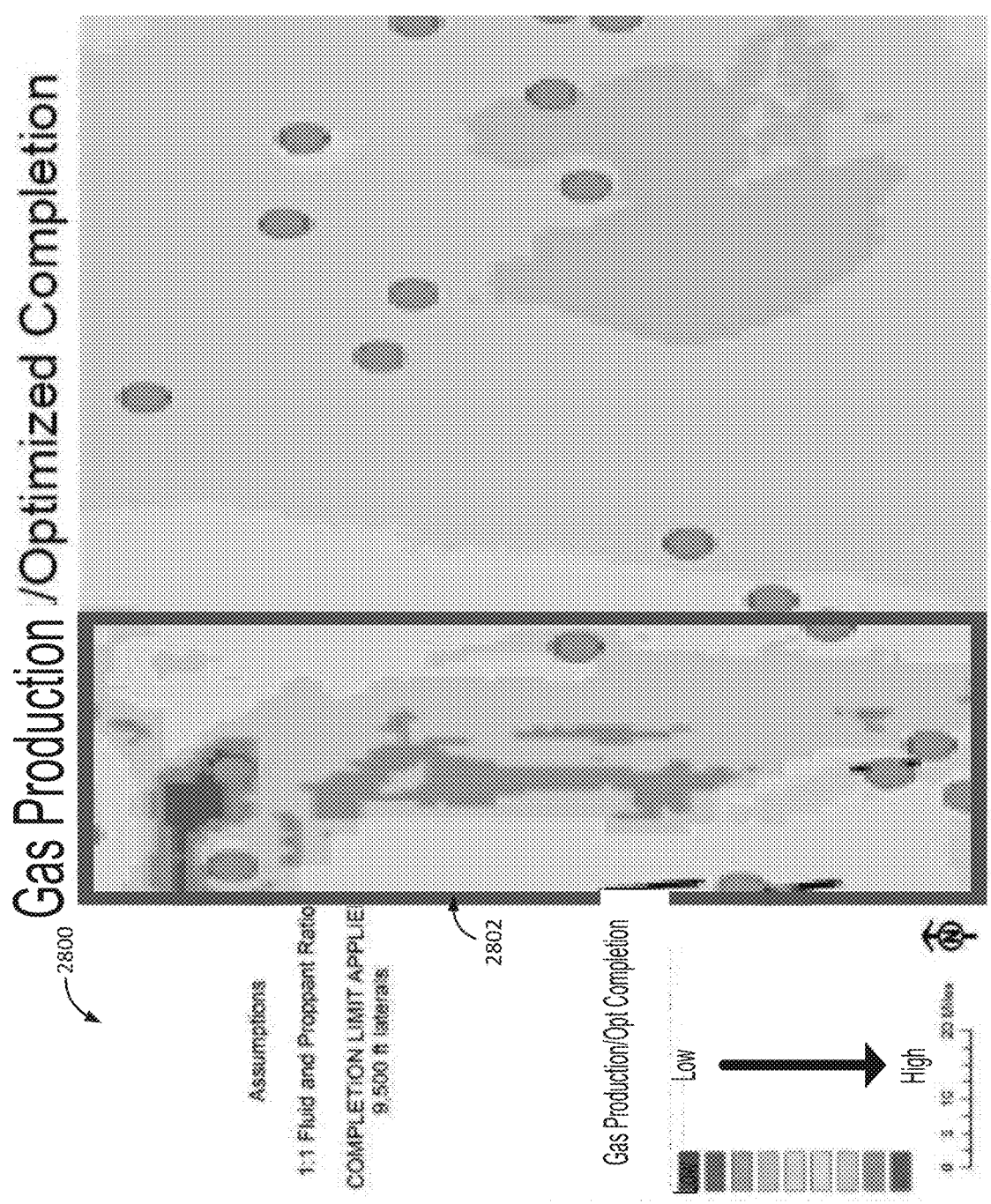
FIG. 28 illustrates an example representation of completion efficiency values, in accordance with one or more implementations.

FIG. 28 illustrates an example representation 2800 of completion efficiency values, in accordance with one or more implementations. FIG. 28 is substantially similar to FIG. 27 except it is directed to gas recovery. Additionally, region 2802 is more valuable than most of the subsurface volume of interest as in FIG. 27.

Figure 29:
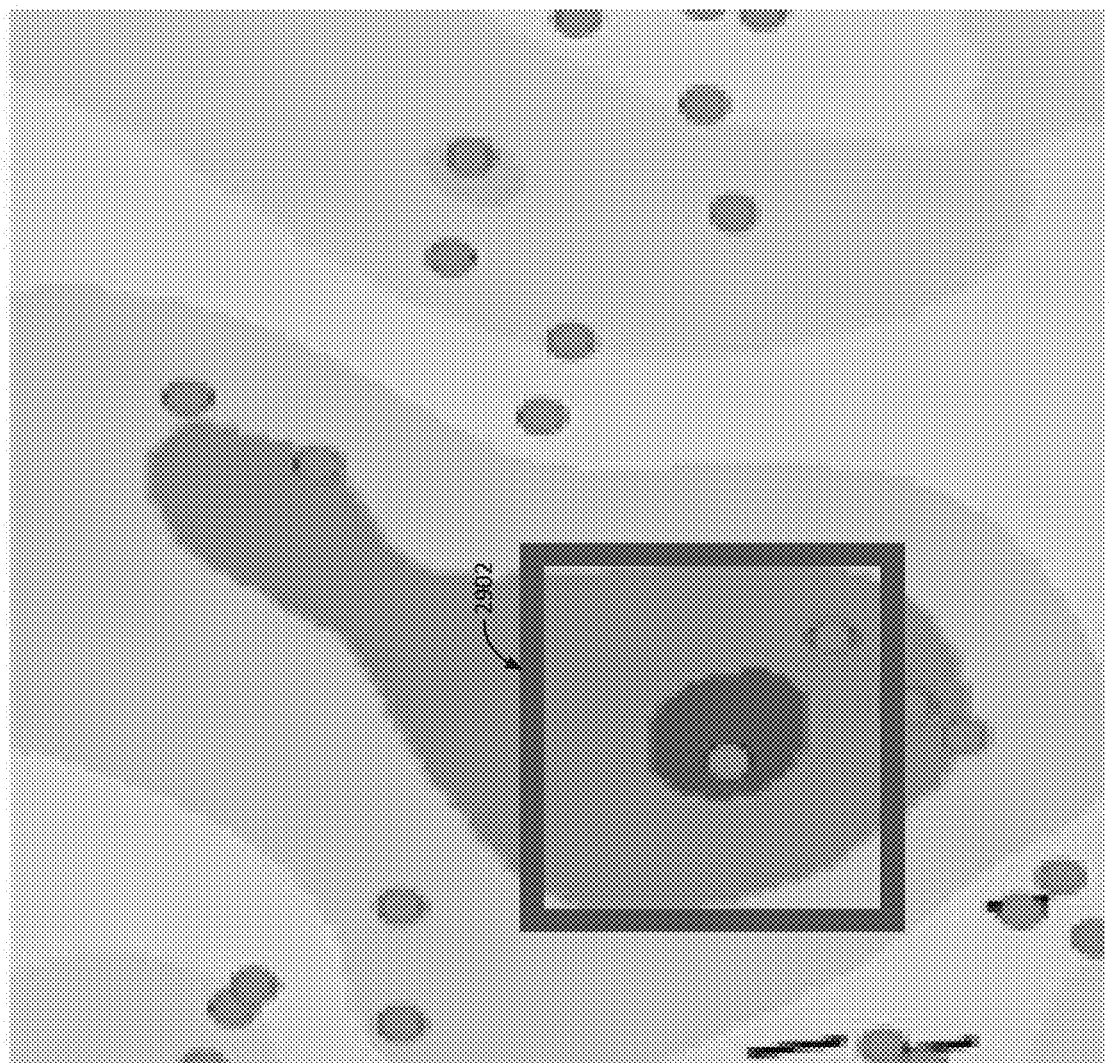
FIG. 29 illustrates an example representation of saturated oil porosity height (SOPHIH), in accordance with one or more implementations.

FIG. 29 illustrates an example representation 2900 of saturated oil porosity height (SOPHIH), in accordance with one or more implementations. The temperature map illustrates a total storage of hydrocarbons as a function of position within the subsurface volume of interest. Region 2902 may have higher storage capacity than other regions in the subsurface volume of interest.

Figure 30:
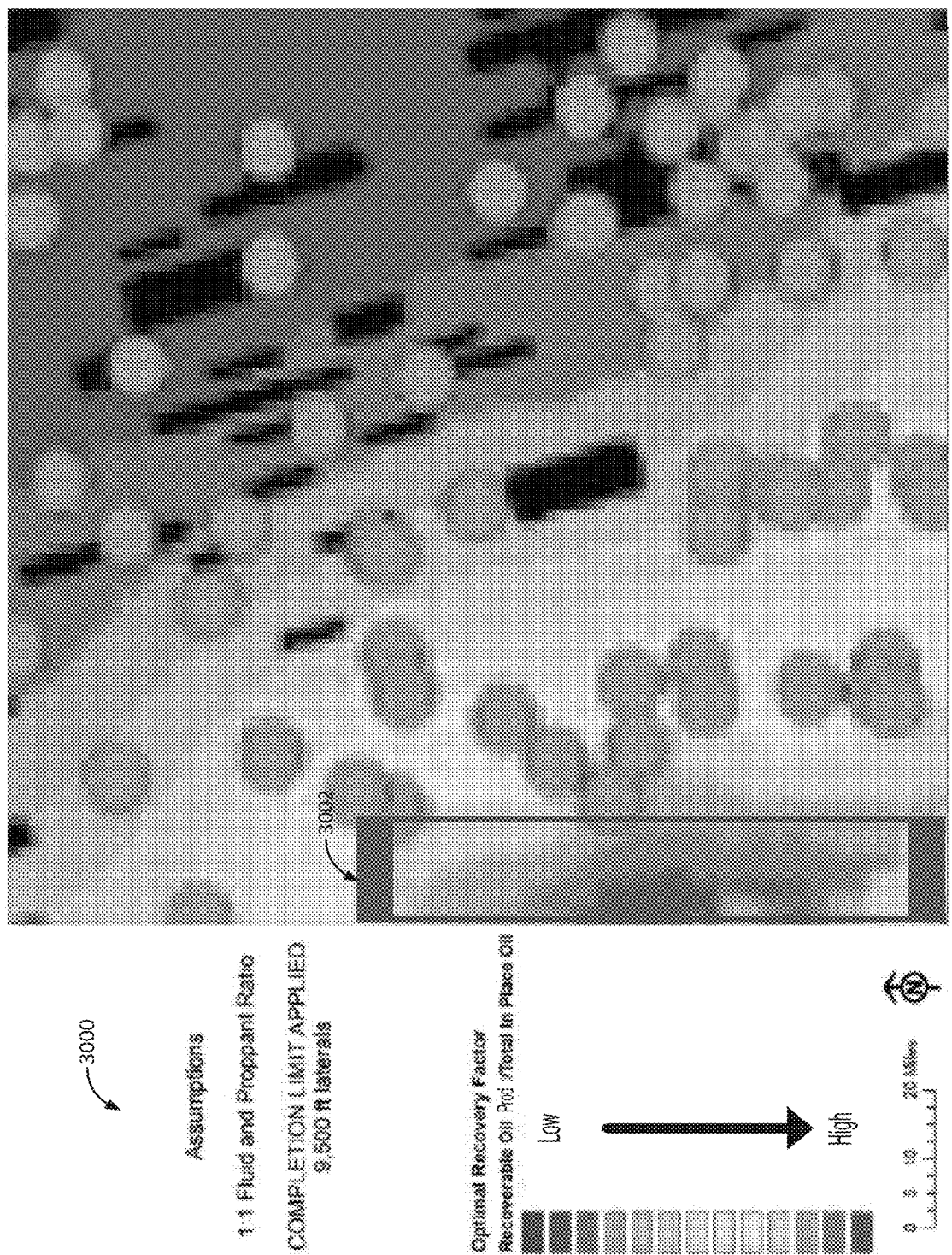
FIG. 30 illustrates an example representation of recovery factor values, in accordance with one or more implementations.

FIG. 30 illustrates an example representation of recovery factor values, in accordance with one or more implementations. The temperature map illustrates how the amount of recoverable hydrocarbons compared to the total amount of hydrocarbons as a function of position in the subsurface volume of interest. As illustrated, region 3002 may have higher recovery factors than the rest of the subsurface volume of interest.

Figure 31:
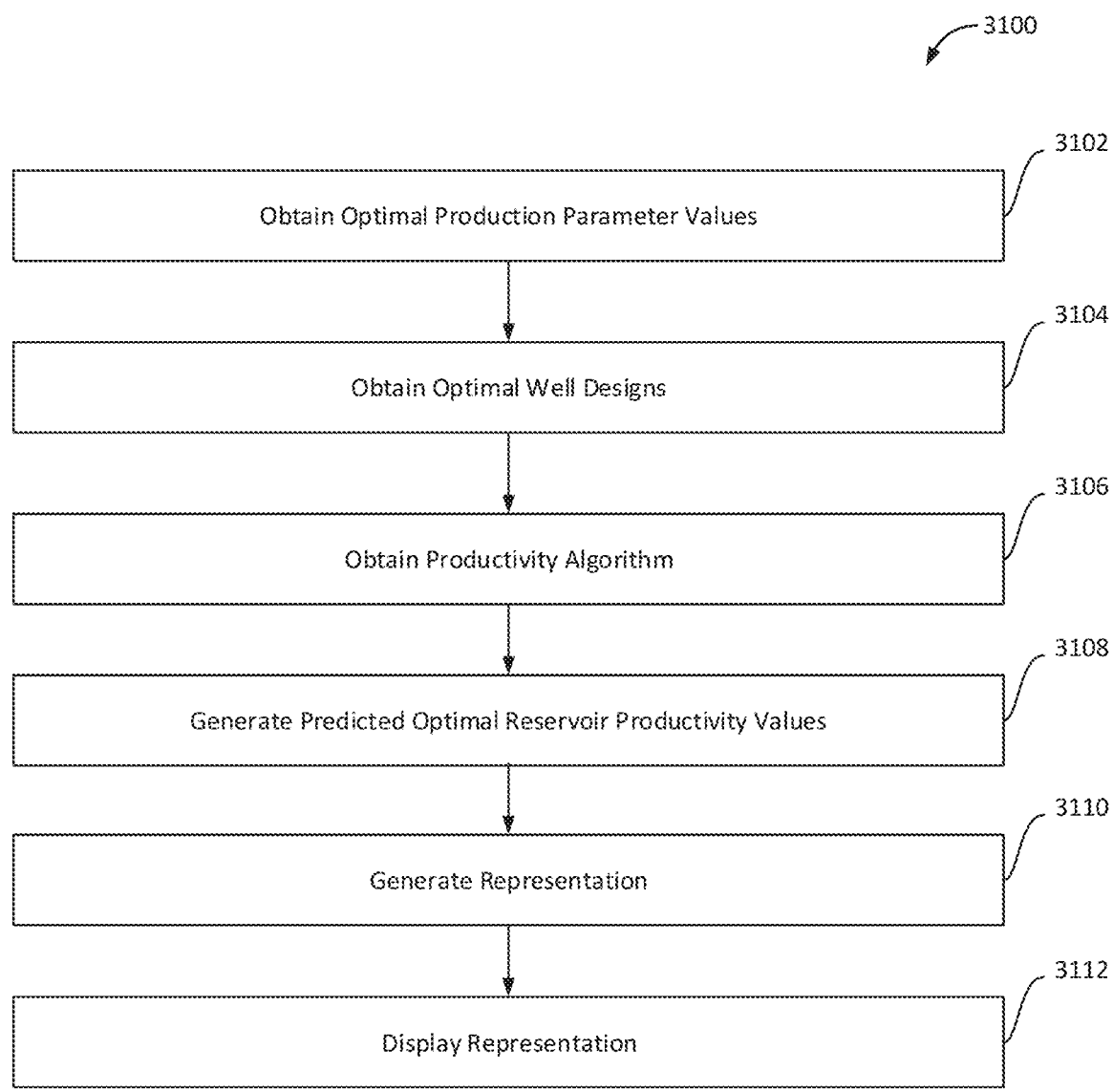
FIG. 31 includes a flow chart of a method for generating refined reservoir productivity values, in accordance with one or more implementations.

FIG. 31 includes a flow chart of a method for generating refined reservoir productivity values, in accordance with one or more implementations. Operation 3102 may include obtaining limited production parameter values. In implementations, limited production parameter values may include at least a portion of refined production parameter values. The multiple limited production parameter values may correspond to multiple limited production parameters characterizing subsurface production features that affect reservoir productivity as a function of position in the subsurface volume of interest, as described herein. The limited production parameter values may have been generated by performing one or more steps. One step may include obtaining subsurface data and well data corresponding to a subsurface volume of interest. The subsurface data and the well data may include production parameter values for multiple production parameters as a function of position in the subsurface volume of interest, thereby characterizing subsurface production features that affect the reservoir productivity. Another step may include obtaining a parameter model, as described above. For example, the parameter model may have been conditioned by training an initial parameter model using training data. The training data may include (i) the well data of one or more wells in the subsurface volume of interest, and (ii) the production parameter values for corresponding multiple production parameters affecting productivity of the one or more wells as a function of position in the subsurface volume of interest. Yet another step may include generating multiple production parameter maps based on the subsurface data and the well data. A given production parameter map may represent the production parameter values for a given production parameter as a function of time and position in the subsurface volume of interest. Another step may include generating limited production parameter values by applying the parameter model to the multiple production parameter maps. In implementations, limited production parameter values may be derived from one or more refined well designs. Operation 3102 may be performed by one or more hardware processors configured by machine-readable instructions including a component that is the same as or similar to subsurface data and well data component 108, parameter model component 110, production parameter graph component 112, and user input component 114 in accordance with one or more implementations. For example, 3102 may be based on the above disclosure corresponding to FIGS. 1-11D, as well as FIGS. 1-11D themselves.

Operation 3104 may include obtaining refined well designs. An individual refined well design may specify multiple design parameter values corresponding to one or more design parameters as a function of position in the subsurface volume of interest. In implementations, the multiple refined well designs may be generated by one or more steps. One step may include obtaining multiple well designs. The multiple well designs may specify multiple design parameter values for one or more design parameters as a function of position in the subsurface volume of interest. Another step may include generating predicted reservoir productivity values by applying the productivity algorithm to the multiple well designs. Yet another step may include generating a best-fit function through a distribution of the multiple well designs and the predicted reservoir productivity values. One step may include parameterizing the best-fit function based on a reservoir productivity parameter. A given refined well design may specify a refined design parameter value corresponding to a given design parameter as a function of position in the subsurface volume of interest. In implementations, the reservoir productivity parameter may include one or more of a cost-value threshold value, a maximum recovery threshold value, and other reservoir productivity parameters. Operation 3104 may be performed by one or more hardware processors configured by machine-readable instructions including a component that is the same as or similar to subsurface data and well data component 108, parameter model component 110, production parameter graph component 112, and user input component 114, in accordance with one or more implementations. For example, 3104 may be based on the above disclosure corresponding to FIGS. 12-21, as well as FIGS. 12-21 themselves.

Operation 3106 may include obtaining a productivity algorithm. As described above, the productivity algorithm may be generated by obtaining an initial productivity algorithm and conditioning the initial productivity algorithm using well design training data. The well design training data may include the refined production parameter values in the subsurface volume of interest, multiple sets of well designs in the subsurface volume of interest, and/or corresponding reservoir productivity values. In implementations, the productivity algorithm may be based on any quantitative or statistical approach to relating well productivity to well design, well completions, and/or reservoir properties (geologic) features. Operation 3106 may be performed by one or more hardware processors configured by machine-readable instructions including a component that is the same as or similar to subsurface data and well data component 108, parameter model component 110, production parameter graph component 112, in accordance with one or more implementations. For example, 3106 may be based on the above disclosure corresponding to FIGS. 12-21, as well as FIGS. 12-21 themselves.

Operation 3108 may include generating refined reservoir productivity values. Operation 3108 may be performed by one or more hardware processors configured by machine-readable instructions including a component that is the same as or similar to reservoir productivity component 118, in accordance with one or more implementations. For example, 3108 may be based on the above disclosure corresponding to FIGS. 22-33, as well as FIGS. 22-33 themselves.

Operation 3110 may include generating a representation. The representation may be of refined reservoir productivity as a function of position in the subsurface volume of interest using visual effects to depict at least a portion of the refined reservoir productivity values. Operation 3110 may be performed by one or more hardware processors configured by machine-readable instructions including a component that is the same as or similar to representation component 116, in accordance with one or more implementations. For example, 3110 may be based on the above disclosure corresponding to FIGS. 22-33, as well as FIGS. 22-33 themselves.

Operation 3112 may include displaying the representation. Operation 3112 may be performed by one or more hardware processors configured by machine-readable instructions including a component that is the same as or similar to representation component 116, in accordance with one or more implementations. For example, 3112 may be based on the above disclosure corresponding to FIGS. 22-33, as well as FIGS. 22-33 themselves.

Figure 32:
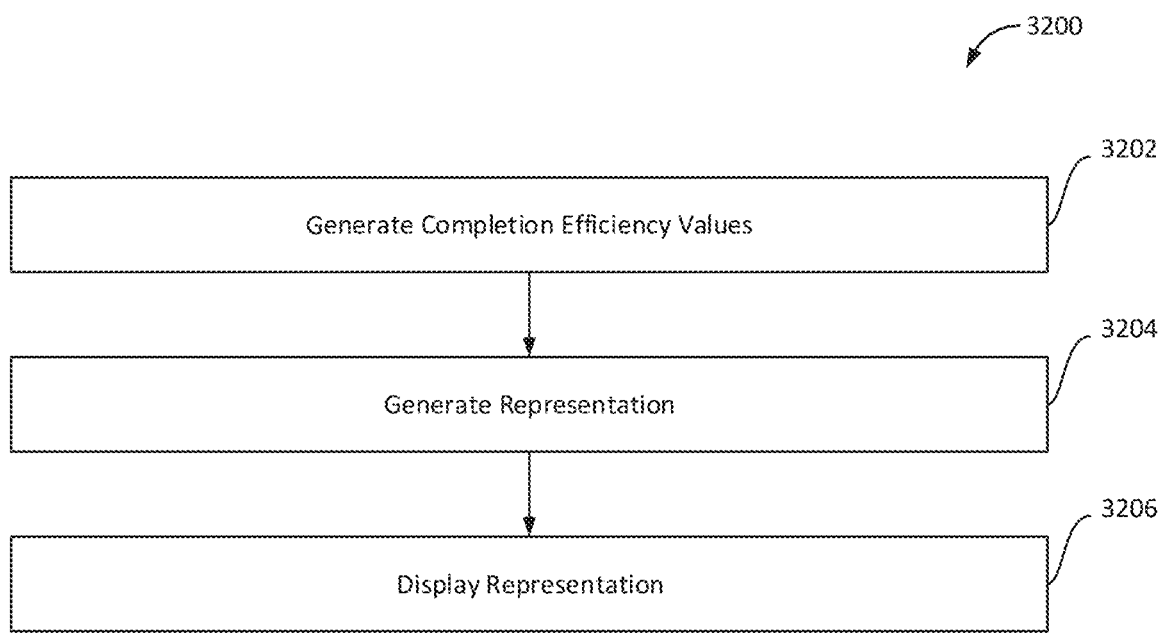
FIG. 32 includes a flow chart of a method for generating completion efficiency values, in accordance with one or more implementations.

FIG. 32 includes a flow chart of a method for generating completion efficiency values, in accordance with one or more implementations. Operation 3202 may include generating completion efficiency values, as described above. Operation 3202 may be performed by one or more hardware processors configured by machine-readable instructions including a component that is the same as or similar to completion efficiency component 120, in accordance with one or more implementations.

Operation 3204 may include generating a representation. The representation may be of completion efficiency as a function of position in the subsurface volume of interest using visual effects to depict at least a portion of the multiple completion efficiency values. Operation 3204 may be performed by one or more hardware processors configured by machine-readable instructions including a component that is the same as or similar to representation component 116, in accordance with one or more implementations.

Operation 3206 may include displaying the representation. Operation 3206 may be performed by one or more hardware processors configured by machine-readable instructions including a component that is the same as or similar to representation component 116, in accordance with one or more implementations.

Figure 33:
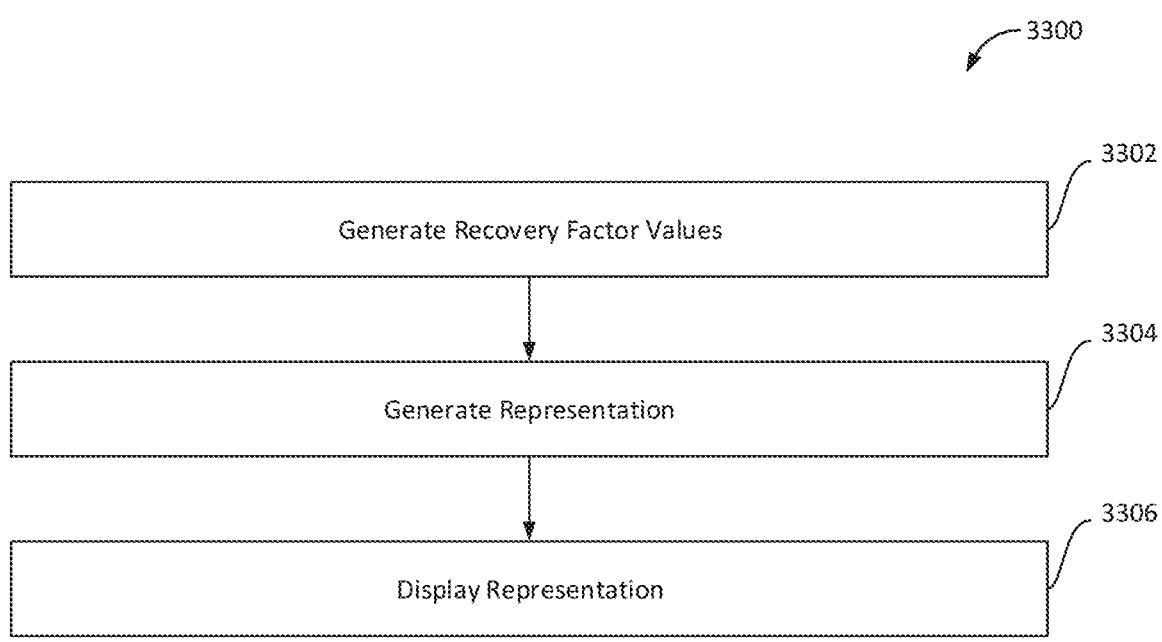
FIG. 33 includes a flow chart of a method for generating recovery factor values, in accordance with one or more implementations.

FIG. 33 includes a flow chart of a method for generating recovery factor values, in accordance with one or more implementations. Operation 3302 may include generating recovery factor values, as described above. Operation 3302 may be performed by one or more hardware processors configured by machine-readable instructions including a component that is the same as or similar to recovery factor component 122, in accordance with one or more implementations.

Operation 3304 may include generating a representation. The representation may be of recovery factor as a function of position in the subsurface volume of interest using visual effects to depict at least a portion of the multiple recovery factor values. Operation 3304 may be performed by one or more hardware processors configured by machine-readable instructions including a component that is the same as or similar to representation component 116, in accordance with one or more implementations.

Operation 3306 may include displaying the representation. Operation 3306 may be performed by one or more hardware processors configured by machine-readable instructions including a component that is the same as or similar to representation component 116, in accordance with one or more implementations.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended Claims. For example, it is to be understood that the present technology contemplates that, to the extent possible, one or more features of any implementation can be combined with one or more features of any other implementation.

While particular implementations are described above, it will be understood it is not intended to limit the presently disclosed technology to these particular implementations. On the contrary, the presently disclosed technology includes alternatives, modifications and equivalents that are within the spirit and scope of the appended claims. Numerous specific details are set forth in order to provide a thorough understanding of the subject matter presented herein. But it will be apparent to one of ordinary skill in the art that the subject matter may be practiced without these specific details. In other instances, well-known methods, procedures, components, and circuits have not been described in detail so as not to unnecessarily obscure aspects of the implementations.

The terminology used in the description of the presently disclosed technology herein is for the purpose of describing particular implementations only and is not intended to be limiting of the presently disclosed technology. As used in the description of the presently disclosed technology and the appended claims, the singular forms "a," "an," and "the" are intended to include the plural forms as well, unless the context clearly indicates otherwise. It will be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, operations, elements, and/or components, but do not preclude the presence or addition of one or more other features, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

Although some of the various drawings illustrate a number of logical stages in a particular order, stages that are not order dependent may be reordered and other stages may be combined or broken out. While some reordering or other groupings are specifically mentioned, others will be obvious to those of ordinary skill in the art and so do not present an exhaustive list of alternatives. Moreover, it should be recognized that the stages could be implemented in hardware, firmware, software or any combination thereof.

The foregoing description, for purpose of explanation, has been described with reference to specific implementations. However, the illustrative discussions above are not intended to be exhaustive or to limit the presently disclosed technology to the precise forms disclosed. Many modifications and variations are possible in view of the above teachings. The implementations were chosen and described in order to best explain the principles of the presently disclosed technology and its practical applications, to thereby enable others skilled in the art to best utilize the presently disclosed technology and various implementations with various modifications as are suited to the particular use contemplated.

What is claimed is:

1. A computer-implemented method for estimating reservoir productivity values that maximize reservoir productivity of a refined well design corresponding to a reservoir productivity parameter, the method being implemented in a computer system that includes a physical computer processor, a graphical user interface, and non-transient electronic storage, the method comprising:
    obtaining multiple limited production parameter values, wherein the limited production parameter values specify subsurface production features that affect the reservoir productivity;
    obtaining multiple refined well designs, wherein individual ones of the multiple refined well designs may specify a design parameter value for a corresponding design parameter;
    obtaining a productivity algorithm that predicts a reservoir productivity based on a production parameter and a well design;
    generating multiple refined reservoir productivity values as a function of position in the subsurface volume of interest by applying the multiple refined well designs and the multiple limited production parameter values to the productivity algorithm;
    generating multiple completion efficiency values based on the multiple refined reservoir productivity values and the multiple refined well designs;
    generating a representation of completion efficiency as a function of position in the subsurface volume of interest using visual effects to depict at least a portion of the multiple completion efficiency values; and
    displaying the representation on the graphical user interface.

2. The computer-implemented method of claim 1, wherein the productivity algorithm has been conditioned by training an initial productivity algorithm using productivity training data, wherein the productivity training data includes (i) the production parameter values in the subsurface volume of interest, (ii) multiple sets of well designs in the subsurface volume of interest, and (iii) corresponding reservoir productivity values.

3. The computer-implemented method of claim 1, further comprising:
generating a representation of refined reservoir productivity as a function of position in the subsurface volume of interest using visual effects to depict at least a portion of the multiple refined reservoir productivity values; and
displaying the representation on the graphical user interface.

4. The computer-implemented method of claim 1, wherein generating multiple completion efficiency values comprises a ratio between the multiple refined reservoir productivity values and corresponding well designs.

5. The computer-implemented method of claim 1, further comprising:
generating multiple recovery factor values;
generating a representation of recovery factor as a function of position in the subsurface volume of interest using visual effects to depict at least a portion of the multiple recovery factor values; and
displaying the representation on the graphical user interface.

6. The computer-implemented method of claim 5, wherein generating multiple recovery factor values comprises:
generating multiple storage volumes as a function of position in the subsurface volume of interest; and
generating the multiple recovery factor values based on the multiple refined reservoir productivity and the multiple storage volumes.

7. The computer-implemented method of claim 1, wherein the multiple refined well designs are generated by:
obtaining multiple well designs;
generating predicted reservoir productivity values by applying the productivity algorithm to the multiple well designs;
generating a best-fit function through a distribution of the multiple well designs and the predicted reservoir productivity values; and
parameterizing the best-fit function based on a reservoir productivity parameter.

8. The computer-implemented method of claim 7, wherein the reservoir productivity parameter comprises one or more of a cost-value threshold value and a maximum recovery threshold value.

9. The computer-implemented method of claim 1, wherein the multiple limited production parameter values are generated by:
obtaining subsurface data and well data corresponding to a subsurface volume of interest;
obtaining a parameter model;
generating multiple production parameter maps based on the subsurface data and the well data; and
generating the multiple limited production parameter values by applying the parameter model to the multiple production parameter maps.

10. The computer-implemented method of claim 9, wherein the parameter model has been conditioned by training an initial parameter model using training data, wherein the training data includes (i) the well data of one or more wells in the subsurface volume of interest, and (ii) production parameter values for corresponding multiple production parameters affecting productivity of the one or more wells as a function of position in the subsurface volume of interest.

11. A system comprising:
a graphical user interface;
non-transient electronic storage; and
a physical computer processor configured by machine-readable instructions to:
obtain multiple limited production parameter values;
obtain multiple refined well designs;
obtain a productivity algorithm that predicts a reservoir productivity based on a production parameter and a well design;
generate multiple refined reservoir productivity values as a function of position in the subsurface volume of interest by applying the multiple refined well designs and multiple limited production parameter values to the productivity algorithm;
generate multiple completion efficiency values based on the multiple refined reservoir productivity values and the multiple refined well designs;
generate a representation of completion efficiency as a function of position in the subsurface volume of interest using visual effects to depict at least a portion of the multiple completion efficiency values; and
display the representation on the graphical user interface.

12. The system of claim 11, wherein the physical computer processor is further configured by machine-readable instructions to:
generate a representation of the multiple refined reservoir productivity values as a function of position in the subsurface volume of interest using visual effects to depict at least a portion of the multiple refined reservoir productivity values; and
display the representation on the graphical user interface.

13. The system of claim 11, wherein the physical computer processor is further configured by machine-readable instructions to:
generate multiple recovery factor values;
generate a representation of recovery factor as a function of position in the subsurface volume of interest using visual effects to depict at least a portion of the multiple recovery factor values; and
display the representation on the graphical user interface.

14. The system of claim 13, wherein generating multiple recovery factor values comprises:
generating storage volumes as a function of position in the subsurface volume of interest; and
generating the multiple recovery factor values based on the multiple refined reservoir productivity values and the storage volumes.

15. The system of claim 11, wherein the multiple refined well designs are generated by:
obtaining multiple well designs;
generating predicted reservoir productivity values by applying the productivity algorithm to the multiple well designs;
generating a best-fit function through a distribution of the multiple well designs and the predicted reservoir productivity values; and
parameterizing the best-fit function based on a reservoir productivity parameter.

16. The system of claim 15, wherein the reservoir productivity parameter comprises one or more of a cost-value threshold value and a maximum recovery threshold value.

17. A computer-implemented method for training an initial productivity algorithm, the method being implemented in a computer system that includes a physical computer processor, a graphical user interface, and non-transient electronic storage, the method comprising:

obtaining productivity training data, wherein the productivity training data includes (i) the production parameter values in the subsurface volume of interest, (ii) multiple sets of well designs in the subsurface volume of interest, and (iii) corresponding reservoir productivity values;

obtaining an initial productivity algorithm to predict a reservoir productivity based on a production parameter and a well design;

generating a productivity algorithm by conditioning the initial productivity algorithm using the productivity training data;

obtaining multiple limited production parameter values;

obtaining multiple refined well designs;

generating multiple refined reservoir productivity values as a function of position in the subsurface volume of interest by applying the multiple refined well designs and multiple limited production parameter values to the productivity algorithm;

generating multiple completion efficiency values based on the multiple refined reservoir productivity values and the multiple refined well designs;

generating a representation of completion efficiency as a function of position in the subsurface volume of interest using visual effects to depict at least a portion of the multiple completion efficiency values; and displaying the representation on the graphical user interface.

18. The computer-implemented method of claim 17, further comprising:

generating a representation of the multiple refined reservoir productivity values as a function of position in the subsurface volume of interest using visual effects to depict at least a portion of the multiple refined reservoir productivity values; and displaying the representation on the graphical user interface.

19. A computer-implemented method for estimating reservoir productivity values that maximize reservoir productivity of a refined well design corresponding to a reservoir productivity parameter, the method being implemented in a computer system that includes a physical computer processor, a graphical user interface, and non-transient electronic storage, the method comprising:

obtaining multiple limited production parameter values, wherein the multiple limited production parameter values specify subsurface production features that affect the reservoir productivity;

obtaining multiple refined well designs, wherein individual ones of the multiple refined well designs may specify a design parameter value for a corresponding design parameter;

obtaining a productivity algorithm that predicts a reservoir productivity based on a production parameter and a well design;

generating multiple refined reservoir productivity values as a function of position in the subsurface volume of interest by applying the multiple refined well designs and the multiple limited production parameter values to the productivity algorithm;

generating multiple recovery factor values based on at least the multiple refined reservoir productivity values;

generating a representation of recovery factor as a function of position in the subsurface volume of interest using visual effects to depict at least a portion of the multiple recovery factor values; and displaying the representation on the graphical user interface.

* * * * *